(12) United States Patent
Anno et al.

(10) Patent No.: US 8,501,385 B2
(45) Date of Patent: *Aug. 6, 2013

(54) POSITIVE-TYPE RADIATION-SENSITIVE COMPOSITION, AND RESIST PATTERN FORMATION METHOD

(75) Inventors: Yusuke Anno, Tokyo (JP); Kouichi Fujiwara, Tokyo (JP); Makoto Sugiura, Tokyo (JP); Gouji Wakamatsu, Tokyo (JP)

(73) Assignee: JSR Corporation, Tokyo (JP)

( * ) Notice: Subject to any disclaimer, the term of this patent is extended or adjusted under 35 U.S.C. 154(b) by 72 days.

This patent is subject to a terminal disclaimer.

(21) Appl. No.: 13/005,536

(22) Filed: Jan. 13, 2011

(65) Prior Publication Data

US 2011/0104612 A1    May 5, 2011

Related U.S. Application Data

(63) Continuation of application No. PCT/JP2009/062750, filed on Jul. 14, 2009.

(30) Foreign Application Priority Data

Jul. 15, 2008  (JP) .................................. 2008-184103
Mar. 27, 2009  (JP) .................................. 2009-080196

(51) Int. Cl.
  *G03C 1/00*   (2006.01)
  *G03F 1/00*   (2012.01)

(52) U.S. Cl.
  USPC .................... 430/270.1; 430/325; 430/326

(58) Field of Classification Search
  USPC .............................................. 430/270.1–326
  See application file for complete search history.

(56) References Cited

U.S. PATENT DOCUMENTS

2006/0160022 A1*  7/2006  Xu et al. .................... 430/270.1
2010/0035177 A1    2/2010  Ishikawa et al.
(Continued)

FOREIGN PATENT DOCUMENTS

EP    1813990    8/2007
EP    2131240    12/2009
(Continued)

OTHER PUBLICATIONS

Supplementary European Search Report for corresponding EP Application No. 09797918.1-2222, Dec. 23, 2011.
(Continued)

*Primary Examiner* — Shean C Wu
*Assistant Examiner* — Connie P Johnson
(74) *Attorney, Agent, or Firm* — Ditthavong Mori & Steiner, P.C.

(57) ABSTRACT

A positive-tone radiation-sensitive composition is used in a resist pattern-forming method as a first positive-tone radiation-sensitive composition. A positive-tone radiation-sensitive composition includes a polymer, a photoacid generator, and a solvent. The polymer includes an acid-labile group and a crosslinkable group. The resist pattern-forming method includes providing the first positive-tone radiation-sensitive composition on a substrate to form a first resist pattern on the substrate. The first resist pattern is made to be inactive to light or heat so that the first resist pattern is insoluble in a second positive-tone radiation-sensitive composition. The second positive-tone radiation-sensitive composition is provided on the substrate to form a second resist pattern on the substrate on which the first resist pattern is formed.

12 Claims, 5 Drawing Sheets

U.S. PATENT DOCUMENTS

| | | |
|---|---|---|
| 2010/0068650 A1 | 3/2010 | Nishimura et al. |
| 2010/0173246 A1 | 7/2010 | Takita |
| 2010/0239978 A1* | 9/2010 | Wada et al. ................ 430/270.1 |
| 2011/0229661 A1 | 9/2011 | Takita |

FOREIGN PATENT DOCUMENTS

| | | |
|---|---|---|
| EP | 2196852 | 6/2010 |
| JP | 2002-202603 | 7/2002 |
| JP | 2007-065503 | 3/2007 |
| JP | 2009-098673 | 5/2009 |
| JP | 2009-139926 | 6/2009 |
| JP | 2009-288343 | 12/2009 |
| JP | 2009-300978 | 12/2009 |
| WO | 2008/038526 | 4/2008 |
| WO | 2008/117693 | 10/2008 |
| WO | 2008/149947 | 12/2008 |
| WO | 2009/041619 | 4/2009 |

OTHER PUBLICATIONS

Sungkoo Lee et al., "Double exposure technology using silicon containing materials", SPIE, 2006, vol. 6153 61531K.

International Preliminary Report on Patentability with Translation of Written Opinion of the International Searching Authority for corresponding International Application No. PCT/JP2009/062750, Feb. 8, 2011.

Japanese Office Action for corresponding JP Application No. 2010-520872, May 7, 2013.

* cited by examiner

US 8,501,385 B2

POSITIVE-TYPE RADIATION-SENSITIVE COMPOSITION, AND RESIST PATTERN FORMATION METHOD

CROSS-REFERENCE TO RELATED APPLICATIONS

The present application is a continuation application of International Application No. PCT/JP2009/062750, filed Jul. 14, 2009, which claims priority to Japanese Patent Application No. 2008-184103, filed Jul. 15, 2008, and Japanese Patent Application No. 2009-080196, filed Mar. 27, 2009. The contents of these applications are incorporated herein by reference in their entirety.

BACKGROUND OF THE INVENTION

1. Field of the Invention

The present invention relates to a positive-tone radiation-sensitive composition and a resist pattern-forming method.

2. Discussion of the Background

In the field of microfabrication such as production of integrated circuit devices, lithographic technology that enables microfabrication with a line width of 0.10 μm or less has been desired to achieve a higher degree of integration.

Lithographic technology that can form a finer pattern (e.g., a fine resist pattern with a line width of about 45 nm) is expected to be required. Such a fine pattern may be formed by reducing the wavelength of the light source of the exposure system (e.g., ArF excimer laser (wavelength: 193 nm)), or increasing the numerical aperture (NA) of the lens, for example. However, an expensive exposure system is required to reduce the wavelength of the light source. When increasing the numerical aperture (NA) of the lens, since the resolution and the depth of focus have a trade-off relationship, a decrease in depth of focus occurs when increasing the resolution.

In recent years, liquid immersion lithography has been proposed as lithographic technology that can solve the above problems.

However, it is considered that liquid immersion lithography can only be applied up to 45 nm half pitch (hp). Therefore, technical development toward a 32 nm hp generation has been conducted. In recent years, technology that forms a 32 nm line-and-space (LS) pattern by forming isolated line patterns or trench patterns by a half pitch utilizing double patterning (DP) or double exposure (DE) has been proposed to deal with a demand for an increase in complexity and density of devices (see SPIE 2006 61531K, for example).

Specifically, when forming a 32 nm LS pattern, 32 nm lines are formed at a pitch of 1:3. A hard mask (hereinafter may be referred to as "HM") (e.g., $SiO_2$) is formed by etching, and 32 nm lines are formed at a pitch of 1:3 at positions displaced from the first-layer resist pattern by a half pitch. A hard mask (HM) is then formed by etching to obtain 32 nm lines at a 1:1 pitch.

However, a material that may suitably be used for double exposure utilizing liquid immersion lithography has not been proposed. Moreover, when forming a second-layer resist pattern using the above method after forming a first-layer resist pattern, the first-layer resist pattern may be deformed, so that the lines may be formed with insufficient accuracy.

SUMMARY OF THE INVENTION

According to one aspect of the present invention, a positive-tone radiation-sensitive composition is used in a resist pattern-forming method as a first positive-tone radiation-sensitive composition. A positive-tone radiation-sensitive composition includes a polymer, a photoacid generator, and a solvent. The polymer includes an acid-labile group and a crosslinkable group. The resist pattern-forming method includes providing the first positive-tone radiation-sensitive composition on a substrate to form a first resist pattern on the substrate. The first resist pattern is made to be inactive to light or heat so that the first resist pattern is insoluble in a second positive-tone radiation-sensitive composition. The second positive-tone radiation-sensitive composition is provided on the substrate to form a second resist pattern on the substrate on which the first resist pattern is formed.

According to another aspect of the present invention, a resist pattern-forming method includes providing a first positive-tone radiation-sensitive composition as the above positive-tone radiation-sensitive composition on a substrate to form a first resist pattern on a substrate. The first resist pattern is made to be inactive to light or heat so that the first resist pattern is insoluble in a second positive-tone radiation-sensitive composition. The second positive-tone radiation-sensitive composition is provided on the substrate to form a second resist pattern on the substrate on which the first resist pattern is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
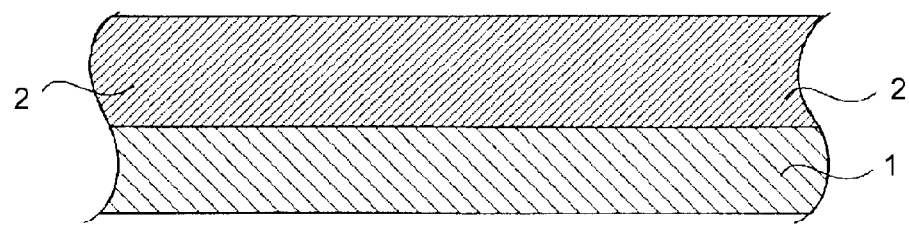
FIG. 1A is a schematic view showing an example of a step (1) of a resist pattern-forming method according to one embodiment of the invention (i.e., a state in which a first resist layer is formed on a substrate)

The embodiments of the invention are described with reference to the accompanying drawings, wherein like reference numerals designate corresponding or identical elements throughout the various drawings. Note that the embodiments of the invention are not limited to the following embodiments. Various modifications and improvements may be made of the following embodiments without departing from the scope of the invention based on the knowledge of a person having ordinary skill in the art.

I. Resist Pattern-forming Method

A resist pattern-forming method according to one embodiment of the invention includes steps (1) to (3). The resist pattern-forming method according to one embodiment of the invention that includes the steps (1) to (3) is described below with reference to the drawings. Note that the term "line pattern" used herein refers to a line-and-space (LS) pattern that includes a line area and a space area.

1. Step (1)

Figure 1B:
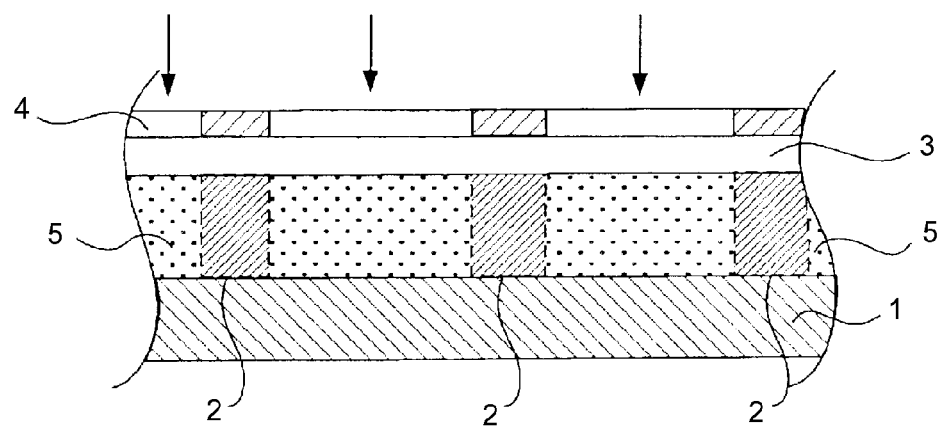
FIG. 1B is a schematic view showing an example of a step (1) of a resist pattern-forming method according to one embodiment of the invention (i.e., a state in which a first resist layer is exposed)
Figure 1C:
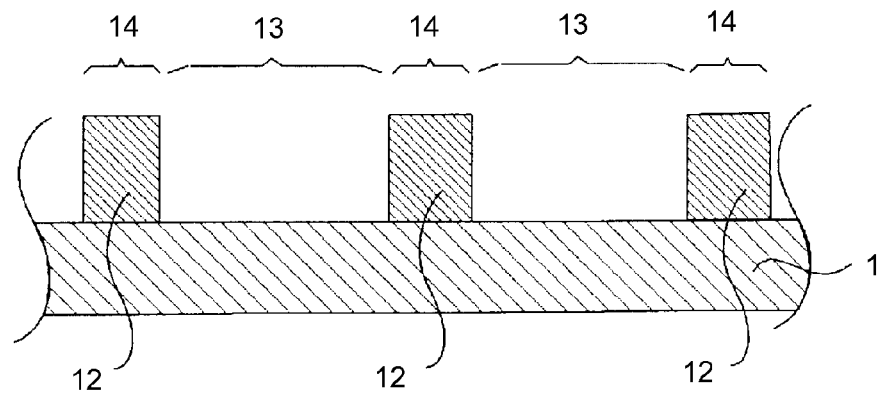
FIG. 1C is a schematic view showing an example of a step (1) of a resist pattern-forming method according to one embodiment of the invention (i.e., a state in which a first resist pattern has been formed)

FIGS. 1A to 1C are schematic views showing an example of the step (1) of the resist pattern-forming method according to one embodiment of the invention. As shown in FIG. 1A, a first resist layer 2 is formed on a substrate 1 using a first positive-tone radiation-sensitive composition. As shown in FIG. 1B, the first resist layer 2 is exposed by applying radiation (arrow in FIG. 1B) to the desired area of the first resist layer 2 through a mask 4 having a given pattern optionally via an immersion liquid 3 (e.g., water) to form an alkali-developable area 5 in the first resist layer 2. The first resist layer 2 is then developed to form a first resist pattern 12 (1L3S) that includes a line area 14 and a space area 13 on the substrate 1 (see FIG. 1C).

(1) Formation of First Resist Layer

The first resist layer 2 may be formed by applying the first positive-tone radiation-sensitive composition to the substrate 1. The first positive-tone radiation-sensitive composition may be applied by an appropriate application method such as rotational coating, cast coating, or roll coating. The thickness of the first resist layer 2 is not particularly limited, but is normally 10 to 1000 nm, and preferably 10 to 500 nm.

After applying the first positive-tone radiation-sensitive composition, the resulting film may optionally be prebaked (PB) to vaporize the solvent from the film. The PB temperature is appropriately selected depending on the composition of the first positive-tone radiation-sensitive composition, but is normally about 30 to 200° C., and preferably 50 to 150° C.

A protective film may be formed on the first resist layer in order to prevent an adverse effect of basic impurities and the like present in the environmental atmosphere, as disclosed in Japanese Patent Application Publication (KOKAI) No. 5-188598, for example. In order to prevent outflow of the acid generator and the like from the first resist layer, a liquid immersion lithography protective film may be formed on the first resist layer, as disclosed in Japanese Patent Application Publication (KOKAI) No. 2005-352384, for example. These methods may be used in combination.

(i) First Positive-tone Radiation-sensitive Composition

The first positive-tone radiation-sensitive composition is a positive-tone radiation-sensitive composition according to one embodiment of the invention (described later).

(ii) Substrate

The substrate is not particularly limited. For example, a silicon wafer, an aluminum-coated wafer, or the like may be used. In order to bring out the potential of the first positive-tone radiation-sensitive composition to a maximum extent, an organic or inorganic antireflective film may be formed on the substrate, as disclosed in Japanese Examined Patent Publication (KOKOKU) No. 6-12452 and Japanese Patent Application Publication (KOKAI) No. 59-93448, for example.

(2) Exposure

As shown in FIG. 1B, the first resist layer 2 is exposed by applying radiation to the desired area of the first resist layer 2 through the mask 4 having a given pattern to form the alkali-developable area 5 in the first resist layer 2. The first resist layer 2 may optionally be exposed via the immersion liquid 3 such as water or a fluorine-based inert liquid.

Radiation used for exposure is appropriately selected from visible rays, ultraviolet rays, deep ultraviolet rays, X-rays, charged particle rays, and the like depending on the type of the photoacid generator (C) included in the first positive-tone radiation-sensitive composition. It is preferable to use deep ultraviolet rays such as ArF excimer laser light (wavelength: 193 nm) or KrF excimer laser light (wavelength: 248 nm). It is particularly preferable to use ArF excimer laser light (wavelength: 193 nm).

The exposure conditions such as the dose are appropriately selected depending on the composition of the first positive-tone radiation-sensitive composition, the type of additive, and the like.

It is preferable to perform post-exposure bake (PEB). The acid-dissociable group included in the first positive-tone radiation-sensitive composition dissociates smoothly due to PEB. The PEB temperature is appropriately selected depending on the composition of the first positive-tone radiation-sensitive composition, but is normally 30 to 200° C., and preferably 50 to 170° C.

(3) Formation of First Resist Pattern

The alkali-developable area is dissolved by developing the first resist layer using a developer, so that the first positive-tone resist pattern 12 that includes the line area 14 and the space area 13 is formed (see FIG. 1C). The resist layer is normally washed with water, and dried after development using the developer.

As the developer, it is preferable to use an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water.

The concentration of the alkaline aqueous solution is normally 10 mass % or less. If the concentration of the aqueous alkaline solution is more than 10 mass %, the unexposed area may also be dissolved in the developer. The expression "insoluble or scarcely soluble in alkali" means that a film that is formed only of polymer has a thickness equal to or more than 50% of the initial thickness when developed under alkaline development conditions employed when forming a resist pattern.

An organic solvent may be added to the alkaline aqueous solution. The organic solvent is preferably used in an amount of 100 vol % or less based on the alkaline aqueous solution. If the amount of the organic solvent is more than 100 vol %, the developability of the resist layer may decrease so that the exposed area may remain undeveloped. An appropriate amount of surfactant or the like may be added to the alkaline aqueous solution.

2. Step (2)

Figure 2:
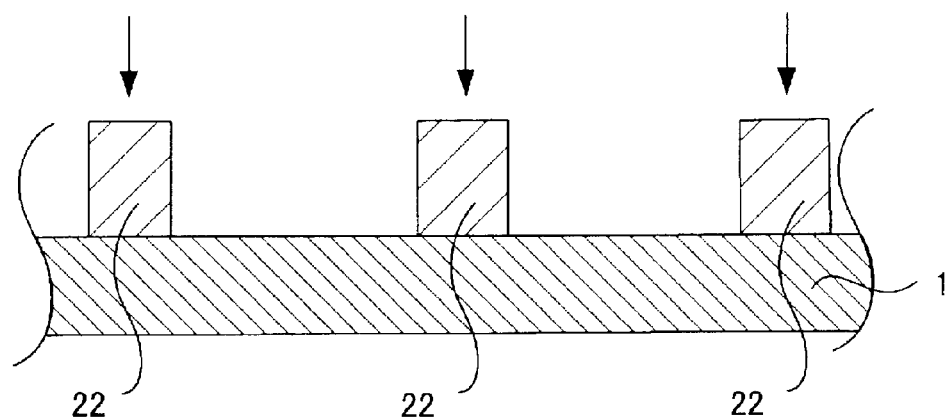
FIG. 2 is a schematic view showing an example of a step (2) of a resist pattern-forming method according to one embodiment of the invention.

FIG. 2 is a schematic view showing an example of the step (2) of the resist pattern-forming method according to one embodiment of the invention. As shown in FIG. 2, the first resist pattern formed by the step (1) is baked at 120° C. or more (preferably 140° C. or more) and/or exposed to radiation (preferably light having a wavelength of 300 nm or less) (arrow in FIG. 2) so that the first resist pattern becomes inactive to light or heat to obtain a first resist pattern 22 that is insoluble in a second positive-tone radiation-sensitive composition.

For example, the first resist pattern may be exposed to radiation at a dose higher than the optimum dose for forming the first resist pattern by a factor of 2 to 20. The first resist pattern may be heated at a temperature higher than the PEB temperature employed when forming the first resist pattern. The first resist pattern may be UV-cured using an $Ar_2$ lamp, a KrCl lamp, a $Kr_2$ lamp, an XeCl lamp, an $Xe_2$ lamp (manufactured by Ushio, Inc.), or the like. These inactivation methods may be used either individually or in combination.

After inactivating the first resist pattern, the first resist pattern may be coated with an insolubilizing resin composition. Examples of the insolubilizing resin composition include a composition that includes a hydroxyl group-containing resin and an alcohol solvent, and is insolubilized upon baking. Specific examples of the insolubilizing resin composition include a composition that includes a resin formed of a monomer that includes an amide bond (amide group) and a monomer that includes a hydroxyl group, a monohydric alcohol having 1 to 8 carbon atoms, and an optional crosslinkable component. A pattern that is insoluble in the second positive-tone radiation-sensitive composition may be formed by applying the insolubilizing resin composition, and baking and developing the applied composition.

The expression "inactive to light" used herein means that the radiation-sensitive resin composition is not sensitive to exposure to radiation or the like. This means that the first resist pattern 22 does not become alkali-soluble upon exposure. The expression "inactive to heat" used herein means that the pattern does not disappear due to heating when forming the second resist pattern using the second positive-tone radiation-sensitive composition.

3. Step (3)

Figure 3A:
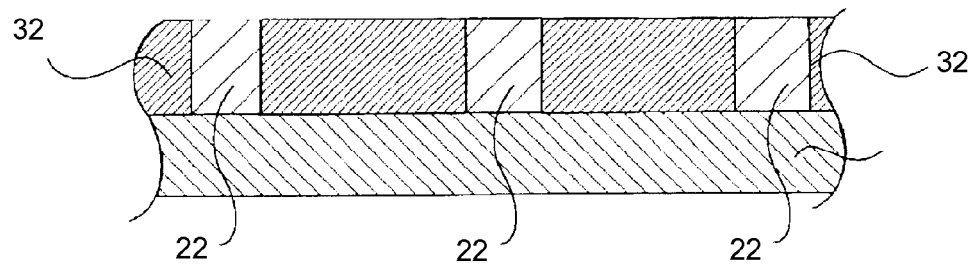
FIG. 3A is a schematic view showing an example of a step (3) of a resist pattern-forming method according to one embodiment of the invention (i.e., a state in which a second resist layer is formed on a substrate)
Figure 3B:
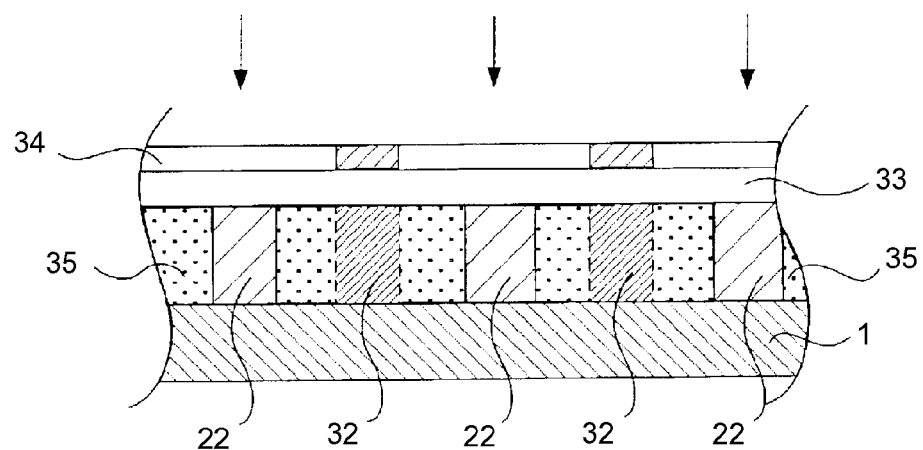
FIG. 3B is a schematic view showing an example of a step (3) of a resist pattern-forming method according to one embodiment of the invention (i.e., a state in which a second resist layer is exposed)
Figure 3C:
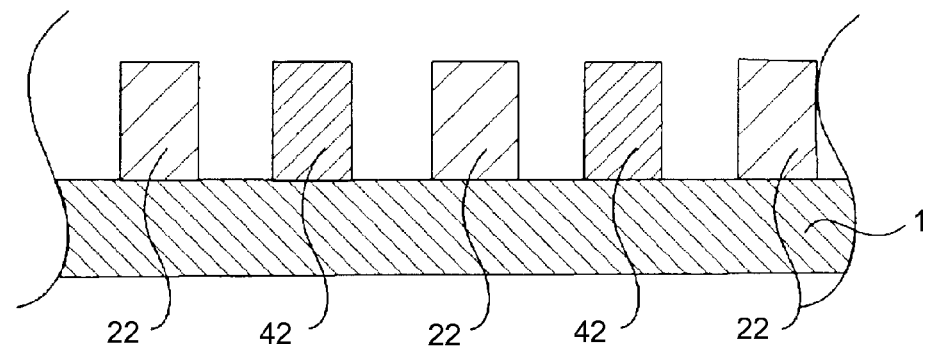
FIG. 3C is a schematic view showing an example of a step (3) of a resist pattern-forming method according to one embodiment of the invention (i.e., a state in which a second resist pattern has been formed)

FIGS. 3A to 3C are schematic views showing an example of the step (3) of the resist pattern-forming method according to one embodiment of the invention. As shown in FIG. 3A, a second resist layer 32 is formed on the substrate 1 on which the first resist pattern 22 is formed using the second positive-tone radiation-sensitive composition. As shown in FIG. 3B, the second resist layer 32 is exposed by applying radiation (arrow in FIG. 3B) to the desired area of the second resist layer 32 through a mask 34 having a given pattern optionally via an immersion liquid 33 (e.g., water) to form an alkali-developable area 55 in the second resist layer 32. As shown in FIG. 3C, the second resist layer 32 is developed to form a second resist pattern 42 on the substrate 1 in the space area of the first resist pattern 22. Note that the space area of the first resist pattern 22 refers to an area from which the first resist layer 2 has been removed due to dissolution of the alkali-developable area 5 during development in the step (1).

(1) Formation of Second Resist Layer

The second resist layer may be formed by applying the second positive-tone radiation-sensitive composition to the substrate on which the first resist pattern is formed. The second positive-tone radiation-sensitive composition may be applied by an appropriate application method such as rotational coating, cast coating, or roll coating. The thickness of the second resist layer is not particularly limited, but is normally 10 to 1000 nm, and preferably 10 to 500 nm.

After applying the second positive-tone radiation-sensitive composition, the resulting film may optionally be prebaked (PB) to vaporize the solvent from the film. The PB temperature is appropriately selected depending on the composition of the second positive-tone radiation-sensitive composition, but is normally about 30 to 200° C., and preferably 50 to 150° C.

The second positive-tone radiation-sensitive composition is described later. The solvent included in the first positive-tone radiation-sensitive composition and the solvent included in the second positive-tone radiation-sensitive composition may be either the same or different. Specifically, since the first resist pattern has become inactive to heat or light, and become insoluble in the second positive-tone radiation-sensitive composition as a result of the step (2), the second resist layer can be formed without mixing with the first resist pattern.

(2) Exposure

As shown in FIG. 3B, the second resist layer 32 is exposed by applying radiation to the space area of the first resist pattern 22 formed on the substrate 1 through the mask 34 having a given pattern to form the alkali-developable area 35 in the second resist layer 32. The second resist layer 32 may optionally be exposed via the immersion liquid 33 such as water or a fluorine-based inert liquid. The exposure conditions and the like mentioned above in connection with the step (1) may be employed.

(3) Formation of Second Resist Pattern

The alkali-developable area is dissolved by developing the second resist layer using a developer to obtain a 1L1S resist pattern in which the first resist pattern 22 and the second resist pattern are alternately arranged (see FIG. 3C). The resist layer is normally washed with water, and dried after development using the developer. The development method mentioned above in connection with the step (1) may be employed.

Figure 4:
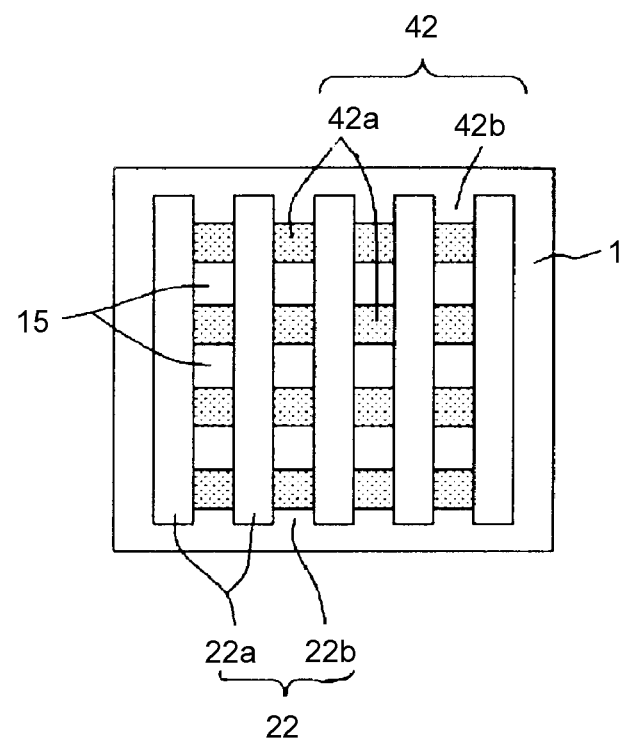
FIG. 4 is a top view showing an example of a resist pattern-forming method according to one embodiment of the invention (i.e., a state in which a line area of a second resist pattern has been formed)

As shown in FIG. 4, a resist pattern (contact hole pattern 15) that is defined by first line areas 22a of the insolubilized first resist pattern 22 and second line areas 42a of the second resist pattern 42 may be formed by forming the second line areas 42a of the second resist pattern 42 formed by the step (3) in first space areas 22b of the first resist pattern 22 in a grid shape, for example.

Figure 5:
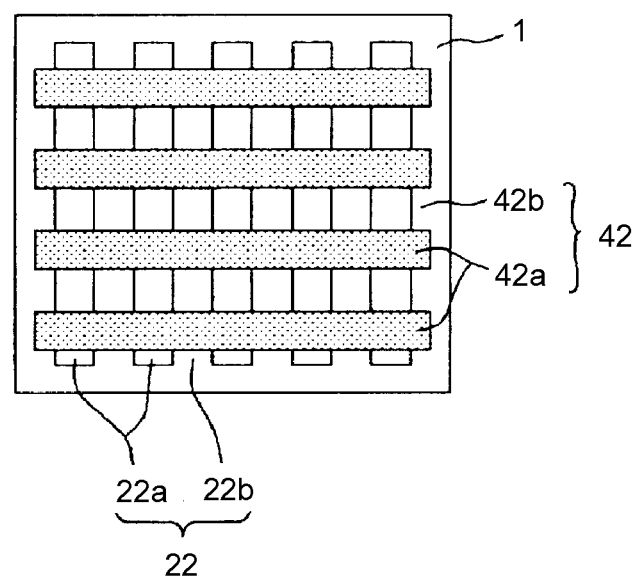
FIG. 5 is a top view showing another example of a resist pattern-forming method according to one embodiment of the invention (i.e., a state in which a line area of a second resist pattern has been formed)
Figure 6:
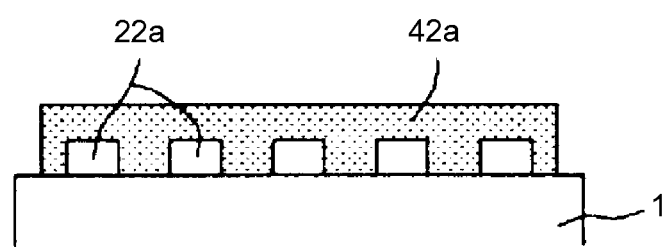
FIG. 6 is a side view showing another example of a resist pattern-forming method according to one embodiment of the invention (i.e., a state in which a line area of a second resist pattern has been formed).

As shown in FIGS. 5 and 6, the second line areas 42a of the second resist pattern 42 formed by the step (3) may be formed over the first line areas 22a of the insolubilized first resist pattern 22 so that the second line areas 42a intersect the first line areas 22a.

In the resist pattern-forming method according to one embodiment of the invention, it is preferable to form the second resist pattern so that the line areas of the first resist pattern intersect the line areas of the second resist pattern, as shown in FIGS. 4 to 6.

II. Positive-tone Radiation-sensitive Composition

The positive-tone radiation-sensitive composition is designed so that the acid-dissociable group included in the composition dissociates due to an acid generated by the acid generator upon exposure so that a carboxyl group is produced. As a result, the solubility of the exposed area in an alkaline developer increases. Therefore, the exposed area is dissolved (removed) in an alkaline developer to obtain a positive-tone resist pattern. The details of the first positive-tone radiation-sensitive composition that is the positive-tone radiation-sensitive composition according to one embodiment of the invention and is used when forming the first resist layer, and the second positive-tone radiation-sensitive composition that is used when forming the second resist layer are described below.

1. First Positive-tone Radiation-sensitive Composition

The first positive-tone radiation-sensitive composition includes (B) a polymer that includes an acid-labile group and a crosslinkable group (hereinafter referred to as "polymer (B)"), (C) a photoacid generator (hereinafter referred to as "acid generator (C)"), and (D) a solvent, and preferably further includes (A) a polymer that includes an acid-labile group, and does not include a crosslinkable group (hereinafter referred to as "polymer (A)"). The first positive-tone radiation-sensitive composition is preferably designed so that the resistance of the first resist pattern to the second resist layer is improved by causing the first resist pattern to be inactive to light or heat by exposing the first resist pattern to light having a wavelength of 300 nm or less and/or heating the first resist pattern at 140° C. or more, so that the first resist pattern remains without being damaged when forming the second resist pattern.

The term "acid-labile group (acid-dissociable group)" used herein refers to a group that dissociates due to an acid. A polymer that includes an acid-labile group and is insoluble or scarcely soluble in alkali becomes alkali-soluble when the acid-labile group has dissociated due to an acid to produce a carboxyl group.

(1) Polymer (A)

The first positive-tone radiation-sensitive resin composition preferably includes the polymer (A). A first resist layer that is dissolved in an alkaline developer due to an acid may be formed by adding the polymer (A) to the first positive-tone radiation-sensitive resin composition.

The polymer (A) preferably includes a repeating unit that includes an acid-labile group and is shown by the following general formula (1) (hereinafter referred to as "repeating unit (1)"), and at least one repeating unit that includes a lactone structure and is selected from the group consisting of repeating units shown by the following general formulas (2-1) to (2-6), or a repeating unit shown by the following general formula (2-7) (hereinafter referred to as "repeating unit (2)").

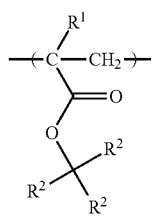

(1)

wherein $R^1$ represents a hydrogen atom, a methyl group, or a trifluoromethyl group, and $R^2$ individually represent a linear or branched alkyl group having 1 to 4 carbon atoms or a monovalent alicyclic hydrocarbon group having 4 to 20 carbon atoms, or two of $R^2$ bond to form a divalent alicyclic hydrocarbon group having 4 to 20 carbon atoms, or a derivative thereof, together with the carbon atom that is bonded thereto, and the remaining $R^2$ represents a linear or branched alkyl group having 1 to 4 carbon atoms, a monovalent alicyclic hydrocarbon group having 4 to 20 carbon atoms, or a derivative thereof.

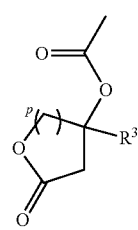

(2-1)

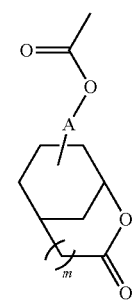

(2-2)

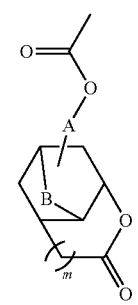

(2-3)

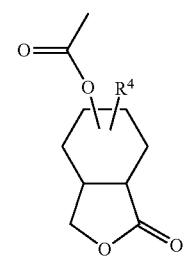

(2-4)

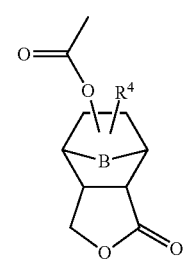

(2-5)

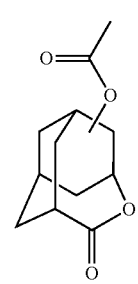

(2-6)

wherein $R^3$ represents a hydrogen atom or a substituted or unsubstituted alkyl group having 1 to 4 carbon atoms, p is an integer from 1 to 3, $R^4$ represents a hydrogen atom or a methoxy group, A represents a single bond or a methylene group, m is 0 or 1, and B represents an oxygen atom or a methylene group.

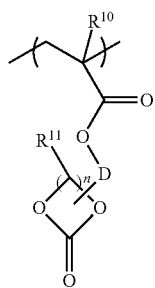

(2-7)

wherein $R^{10}$ represents a hydrogen atom, a methyl group, or a trifluoromethyl group, $R^{11}$ individually represent a hydrogen atom or a chain-like hydrocarbon group having 1 to 5 carbon atoms, D represents a single bond, a divalent or trivalent chain-like hydrocarbon group having 1 to 30 carbon atoms, a divalent or trivalent alicyclic hydrocarbon group having 3 to 30 carbon atoms, or a divalent or trivalent aromatic hydrocarbon group having 6 to 30 carbon atoms, provided that a carbon atom included in D is bonded to a carbon atom that forms the cyclic carbonate to form a cyclic structure when D represents a trivalent group, and n is an integer from 2 to 4.

Examples of the linear or branched alkyl group having 1 to 4 carbon atoms represented by $R^2$ in the general formula (1) include a methyl group, an ethyl group, an n-propyl group, an i-propyl group, an n-butyl group, a 2-methylpropyl group, a 1-methylpropyl group, a t-butyl group, and the like.

Examples of the monovalent alicyclic hydrocarbon group having 4 to 20 carbon atoms include a group that includes an alicyclic ring derived from a cycloalkane such as norbornane, tricyclodecane, tetracyclododecane, adamantane, cyclobutane, cyclopentane, cyclohexane, cycloheptane, or cyclooctane; a group obtained by substituting the above group with a linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group; and the like.

Examples of the divalent alicyclic hydrocarbon group having 4 to 20 carbon atoms, or a derivative thereof, formed by two $R^2$ include a group that includes an alicyclic ring derived from norbornane, tricyclodecane, tetracyclododecane, adamantane, cyclopentane, or cyclohexane; a group obtained by substituting the above group with a linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group; and the like.

Examples of a preferable group shown by $-C(R^2)_3$ in the general formula (1) include groups that do not include an alicyclic ring, such as a t-butyl group, a 1-n-(1-ethyl-1-methyl)propyl group, a 1-n-(1,1-dimethyl)propyl group, a 1-n-(1,1-dimethyl)butyl group, a 1-n-(1,1-dimethyl)pentyl group, 1-(1,1-diethyl)propyl group, a 1-n-(1,1-diethyl)butyl group, and a 1-n-(1,1-diethyl)pentyl group; groups that include an alicyclic ring, such as a 1-(1-methyl)cyclopentyl group, a 1-(1-ethyl)cyclopentyl group, a 1-(1-n-propyl)cyclopentyl group, a 1-(1-i-propyl)cyclopentyl group, a 1-(1-methyl)cyclohexyl group, a 1-(1-ethyl)cyclohexyl group, a 1-(1-n-propyl)cyclohexyl group, a 1-(1-i-propyl)cyclohexyl group, a 1-(1-methyl-1-(2-norbornyl))ethyl group, a 1-(1-methyl-1-(2-tetracyclodecanyl))ethyl group, a 1-(1-methyl-1-(1-adamantyl))ethyl group, a 2-(2-methyl)norbornyl group, a 2-(2-ethyl)norbornyl group, a 2-(2-n-propyl)norbornyl group, a 2-(2-i-propyl)norbornyl group, a 2-(2-methyl)tetracyclodecanyl group, a 2-(2-ethyl)tetracyclodecanyl group, a 2-(2-n-propyl)tetracyclodecanyl group, a 2-(2-i-propyl)tetracyclodecanyl group, a 1-(1-methyl)adamantyl group, a 1-(1-ethyl)adamantyl group, a 1-(1-n-propyl)adamantyl group, and a 1-(1-i-propyl)adamantyl group; a group obtained by substituting the above group with a linear or branched alkyl group having 1 to 10 carbon atoms, such as a methyl group, an ethyl group, a n-propyl group, an i-propyl group, an n-butyl group, a 2-methylpropyl group, a 1-methylpropyl group, or a t-butyl group, or a cyclic alkyl group having 4 to 20 carbon atoms, such as a cyclopentyl group, a cyclohexyl group, or a cyclooctyl group; and the like.

Examples of the substituted or unsubstituted alkyl group having 1 to 4 carbon atoms represented by $R^3$ in the general formula (2-1) include a methyl group, an ethyl group, an n-propyl group, an i-propyl group, an n-butyl group, a 2-methylpropyl group, a 1-methylpropyl group, a t-butyl group, and the like.

n in the general formula (2-7) is an integer from 2 to 4. Specifically, the cyclic carbonate structure has a 5-membered ring structure when n is 2 (ethylene group), has a 6-membered ring structure when n is 3 (propylene group), and has a 7-membered ring structure when n is 4 (butylene group).

When D in the general formula (2-7) represents a single bond, the oxygen atom of (meth)acrylic acid that forms the polymer is directly bonded to the carbon atom that forms the cyclic carbonate structure.

The term "chain-like hydrocarbon group" used herein refers to a hydrocarbon group that does not include a cyclic structure in the main chain, and includes only a chain-like structure. The term "alicyclic hydrocarbon group" used herein refers to a hydrocarbon group that includes only an alicyclic hydrocarbon structure as a ring structure, and does not include an aromatic ring structure. Note that the alicyclic hydrocarbon group need not necessarily be formed only of an alicyclic hydrocarbon structure, but may include a chain-like structure. The term "aromatic hydrocarbon group" used herein refers to a hydrocarbon group that includes an aromatic ring structure. Note that the aromatic hydrocarbon group need not necessarily be formed only of an aromatic ring structure, but may include a chain-like structure or an alicyclic hydrocarbon structure.

Specific examples of the structure when D in the general formula (2-7) represents a chain-like hydrocarbon group include a structure in which the oxygen atom of (meth)acrylic acid that forms the polymer is bonded to a carbon atom that forms the cyclic carbonate structure via a linear alkyl group having 1 to 5 carbon atoms (i.e., repeating units shown by the general formulas (2-7-1) to (2-7-6) described later). The chain-like hydrocarbon group may be substituted (i.e., a repeating unit shown by the general formula (2-7-16) described later).

A carbon atom included in D in the general formula (2-7) and a carbon atom that forms the cyclic carbonate structure may be bonded to form a cyclic structure. Specifically, the cyclic carbonate structure may form part of a bridged ring, a condensed ring, or a spiro ring. For example, a bridged ring or a condensed ring is formed when the cyclic structure includes two carbon atoms of the cyclic carbonate structure, and a spiro ring is formed when the cyclic structure includes only one carbon atom of the cyclic carbonate structure. The repeating units shown by the general formulas (2-7-7), (2-7-9), (2-7-11), (2-7-12), (2-7-15), and (2-7-17) to (2-7-22) are examples in which a condensed ring (5 to 6-membered ring) that includes a carbon atom included in D and two carbon atoms that form the cyclic carbonate structure is formed. The repeating units shown by the general formulas (2-7-10) and (2-7-14) are examples in which a spiro ring that includes a carbon atom included in D and one carbon atom that forms the cyclic carbonate structure is formed. Note that the cyclic structure may be a hetero ring that includes a heteroatom (e.g., oxygen atom (O) or nitrogen atom (N)) (i.e., repeating units shown by the general formula (2-7-17) to (2-7-22) described later). The repeating units shown by the general formulas (2-7-8) and (2-7-13) are examples in which a bridged ring that includes two carbon atoms included in D and two carbon atoms that form the cyclic carbonate structure is formed.

Examples of the divalent alicyclic hydrocarbon group include monocyclic cycloalkylene groups having 3 to 10 carbon atoms, such as a 1,3-cyclobutylene group, a 1,3-cyclopentylene group, a 1,4-cyclohexylene group, and a 1,5-cyclooctylene group; polycyclic cycloalkylene groups such as a 1,4-norbornylene group, a 2,5-norbornylene group, a 1,5-admantylene group, and a 2,6-admantylene group; and the like. Examples of the trivalent alicyclic hydrocarbon group include groups obtained by elimination of one hydrogen atom from a monocyclic cycloalkylene group or a polycyclic cycloalkylene group, and the like.

Examples of the structure when D in the general formula (2-7) represents an alicyclic hydrocarbon group include a structure in which the oxygen atom of (meth)acrylic acid that forms the polymer is bonded to a carbon atom that forms the cyclic carbonate structure via a cyclopentylene group (i.e., a repeating unit shown by the general formula (2-7-10) described later), a structure in which the oxygen atom of (meth)acrylic acid that forms the polymer is bonded to a carbon atom that forms the cyclic carbonate structure via a norbornylane group (i.e., repeating units shown by the general formulas (2-7-11) and (2-7-12) described later), a structure in which the oxygen atom of (meth)acrylic acid that forms the polymer is bonded to a carbon atom that forms the cyclic carbonate structure via a substituted tetradecahydrophenanthryl group (i.e., a repeating unit shown by the general formula (2-7-14) described later), and the like.

The repeating units shown by the general formulas (2-7-11) and (2-7-12) are examples in which a condensed ring (4 to 5-membered ring) that includes a carbon atom included in D and two carbon atoms that form the cyclic carbonate structure is formed. The repeating units shown by the general formulas (2-7-10) and (2-7-14) are examples in which a spiro ring that includes a carbon atom included in D and one carbon atom that forms the cyclic carbonate structure is formed.

Examples of the divalent aromatic hydrocarbon group include arylene groups such as a phenylene group, a tolylene group, a naphthylene group, a phenanthrylene group, and an anthrylene group, and the like. Examples of the trivalent aromatic hydrocarbon group include groups obtained by elimination of one hydrogen atom from an arylene group, and the like.

Examples of the structure when D in the general formula (2-7) represents an aromatic hydrocarbon group include a structure in which the oxygen atom of (meth)acrylic acid that forms the polymer is bonded to a carbon atom that forms the cyclic carbonate structure via a benzylene group (i.e., a repeating unit shown by the general formula (2-7-15) described later). The repeating unit shown by the general formula (2-7-15) is an example in which a condensed ring (6-membered ring) that includes a carbon atom included in D and two carbon atoms that form the cyclic carbonate structure is formed.

(i) Repeating Unit (1)

Examples of a preferable monomer that produces the repeating unit (1) include 2-methyladamant-2-yl (meth)acrylate, 2-methyl-3-hydroxyadamant-2-yl (meth)acrylate, 2-ethyladamant-2-yl (meth)acrylate, 2-ethyl-3-hydroxyadamant-2-yl (meth)acrylate, 2-n-propyladamant-2-yl (meth)acrylate, 2-isopropyladamant-2-yl (meth)acrylate, 2-methylbicyclo[2.2.1]hept-2-yl (meth)acrylate, 2-ethylbicyclo[2.2.1]hept-2-yl (meth)acrylate, 8-methyltricyclo[5.2.1.0$^{2,6}$]decan-8-yl (meth)acrylate, 8-ethyltricyclo[5.2.1.0$^{2,6}$]decan-8-yl (meth)acrylate, 4-methyltetracyclo[6.2.1.1$^{3,6}$.0$^{2,7}$]dodecan-4-yl (meth)acrylate, 4-ethyltetracyclo[6.2.1.1$^{3,6}$.0$^{2,7}$]dodecan-4-yl (meth)acrylate, 1-(bicyclo[2.2.1]hept-2-yl)-1-methylethyl (meth)acrylate, 1-(tricyclo[5.2.1.0$^{2,6}$]decan-8-yl)-1-methylethyl (meth)acrylate, 1-(tetracyclo[6.2.1.1$^{3,6}$.0$^{2,7}$]dodecan-4-yl)-1-methylethyl (meth)acrylate, 1-(adamantan-1-yl)-1-methylethyl (meth)acrylate, 1-(3-hydroxyadamantan-1-yl)-1-methylethyl (meth)acrylate, 1,1-dicyclohexylethyl (meth)acrylate, 1,1-di(bicyclo[2.2.1]hept-2-yl)ethyl (meth)acrylate, 1,1-di(tricyclo[5.2.1.0$^{2,6}$]decan-8-yl)ethyl (meth)acrylate, 1,1-di(tetracyclo[6.2.1.1$^{3,6}$.0$^{2,7}$]dodecan-4-yl)ethyl (meth)acrylate, 1,1-di(adamantan-1-yl)ethyl (meth)acrylate, 1-methyl-1-cyclopentyl (meth)acrylate, 1-ethyl-1-cyclopentyl (meth)acrylate, 1-methyl-1-cyclohexyl (meth)acrylate, 1-ethyl-1-cyclohexyl (meth)acrylate, and the like. Note that the term "(meth)acrylic acid" used herein refers to acrylic acid and methacrylic acid.

Among these, 2-methyladamantyl-2-yl (meth)acrylate, 2-ethyladamantyl-2-yl (meth)acrylate, 2-methylbicyclo[2.2.1]hept-2-yl (meth)acrylate, 2-ethylbicyclo[2.2.1]hept-2-yl (meth)acrylate, 1-(bicyclo[2.2.1]hept-2-yl)-1-methylethyl (meth)acrylate, 1-(adamantan-1-yl)-1-methylethyl (meth)acrylate, 1-methyl-1-cyclopentyl (meth)acrylate, 1-ethyl-1-cyclopentyl (meth)acrylate, 1-methyl-1-cyclohexyl (meth)acrylate, 1-ethyl-1-cyclohexyl (meth)acrylate, and the like are particularly preferable.

The polymer (A) may include only one type of repeating unit (1), or may include two or more types of repeating unit (1).

(ii) Repeating Unit (2)

Examples of a preferable monomer that produces the repeating unit (2) include 5-oxo-4-oxa-tricyclo[4.2.1.0$^{3,7}$]non-2-yl (meth)acrylate, 9-methoxycarbonyl-5-oxo-4-oxatricyclo[4.2.1.0$^{3,7}$]non-2-yl (meth)acrylate, 5-oxo-4-oxatricyclo[5.2.1.0$^{3,8}$]dec-2-yl (meth)acrylate, 10-methoxycarbonyl-5-oxo-4-oxatricyclo[5.2.1.0$^{3,8}$]dec-2-yl (meth)acrylate, 6-oxo-7-oxabicyclo[3.2.1]oct-2-yl (meth)acrylate, 4-methoxycarbonyl-6-oxo-7-oxabicyclo[3.2.1]oct-2-yl (meth)acrylate, 7-oxo-8-oxabicyclo[3.3.1]non-2-yl (meth)acrylate, 4-methoxycarbonyl-7-oxo-8-oxabicyclo[3.3.1]non-2-yl (meth)acrylate, 2-oxotetrahydropyran-4-yl (meth)acrylate, 4-methyl-2-oxotetrahydropyran-4-yl (meth)acrylate, 4-ethyl-2-oxotetrahydropyran-4-yl (meth)acrylate, 4-propyl-2-oxotetrahydropyran-4-yl (meth)acrylate, 5-oxotetrahydrofuran-3-yl (meth)acrylate, 2,2-dimethyl-5-oxotetrahydrofuran-3-yl (meth)acrylate, 4,4-dimethyl-5-oxotetrahydrofuran-3-yl (meth)acrylate, 2-oxotetrahydrofuran-3-yl (meth)acrylate, 4,4-dimethyl-2-oxotetrahydrofuran-3-yl (meth)acrylate, 5,5-dimethyl-2-oxotetrahydrofuran-3-yl (meth)acrylate, 2-oxotetrahydrofuran-3-yl (meth)acrylate, 5-oxotetrahydrofuran-2-ylmethyl (meth)acrylate, 3,3-dimethyl-5-oxotetrahydrofuran-2-ylmethyl (meth)acrylate, 4,4-dimethyl-5-oxotetrahydrofuran-2-ylmethyl (meth)acrylate, and the like. Among these, 5-oxo-4-oxatricyclo[4.2.1.0$^{3,7}$]non-2-yl (meth)acrylate is preferable.

The monomer that produces the repeating unit shown by the general formula (2-7) may be synthesized by the method disclosed in Tetrahedron Letters, Vol. 27, No. 32, p. 3741 (1986), Organic Letters, Vol. 4, No. 15, p. 2561 (2002), or the like.

Examples of a particularly preferable repeating unit shown by the general formula (2-7) include repeating units shown by the following general formulas (2-7-1) to (2-7-22).

(2-7-1)
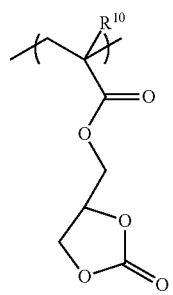

(2-7-2)
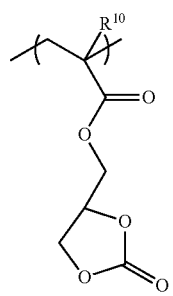

(2-7-3)
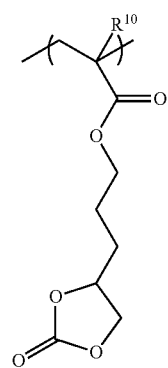

-continued (2-7-4)
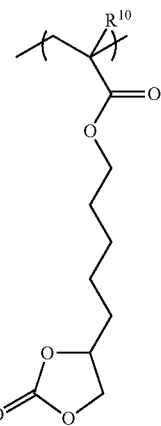

(2-7-5)
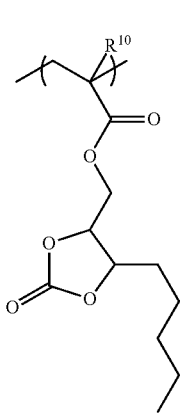

(2-7-6)
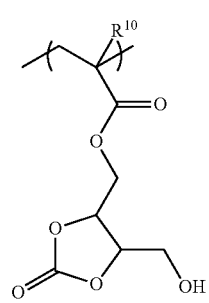

(2-7-7)
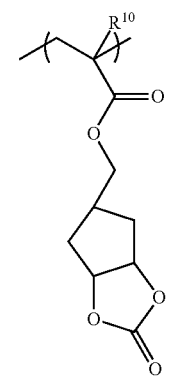

-continued
(2-7-8)
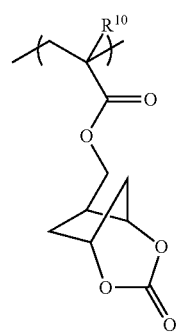
(2-7-9)
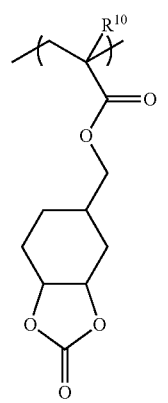
(2-7-10)
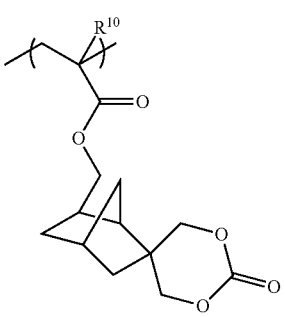
(2-7-11)
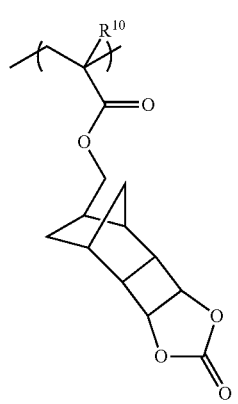
(2-7-12)
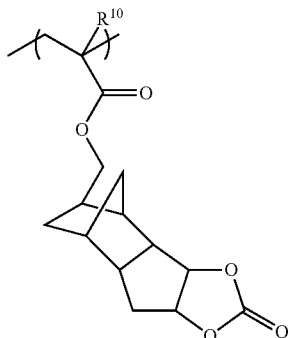
(2-7-13)
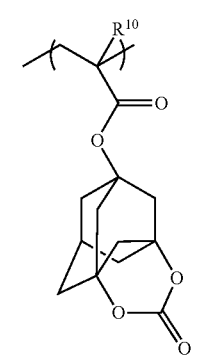
(2-7-14)
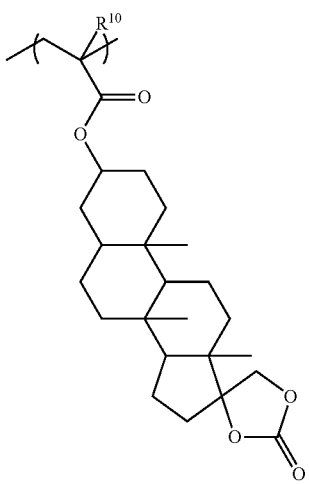
(2-7-15)
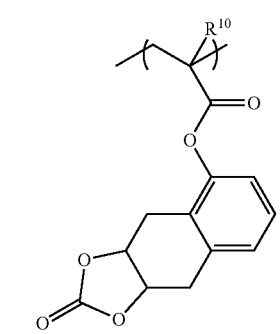

(2-7-16)
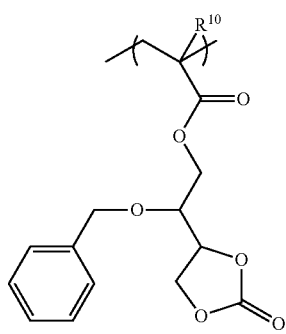

(2-7-17)
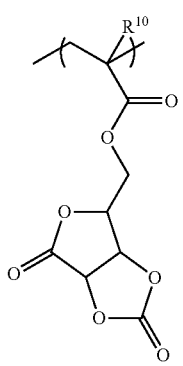

(2-7-18)
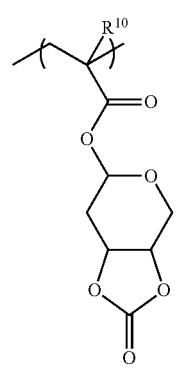

(2-7-19)
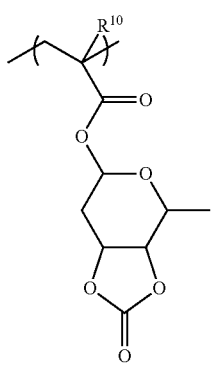

(2-7-20)
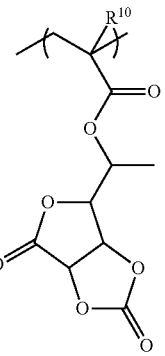

(2-7-21)
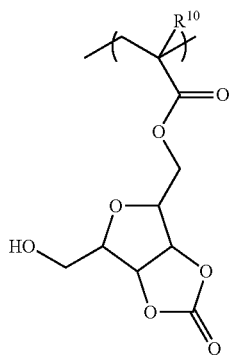

(2-7-22)
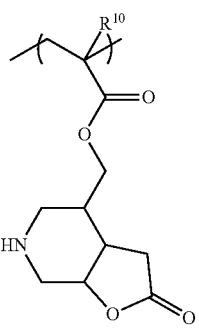

wherein $R^{10}$ represents a hydrogen atom, a methyl group, or a trifluoromethyl group.

It is particularly preferable that the polymer (A) include at least one repeating unit selected from the repeating units shown by the general formulas (2-7-1) to (2-7-6) as the repeating unit shown by the general formula (2-7) from the viewpoint of improving the solubility of the polymer (A) in a developer.

The polymer (A) may include only one type of repeating unit (2), or may include two or more types of repeating unit (2).

The content of each repeating unit based on the total content (=100 mol %) of the repeating units included in the polymer (A) is preferably as follows. The content of the repeating unit (1) is preferably 20 to 90 mol %, more preferably 20 to 80 mol %, and still more preferably 20 to 70 mol %. If the content of the repeating unit (1) is within the above range, water repellency can be achieved after application while increasing the contact angle with a developer after PEB.

The content of the repeating unit (2) is normally 80 mol % or less, preferably 20 to 80 mol %, and more preferably 30 to 70 mol %. If the content of the repeating unit (2) is within the above range, the difference between the advancing contact angle and the receding contact angle can be reduced.

The polymer (A) may include a repeating unit (hereinafter referred to as "additional repeating unit") other than the repeating units (1) and (2).

Examples of the additional repeating unit include a repeating unit shown by the following general formula (6) (hereinafter referred to as "repeating unit (6)"), a repeating unit shown by the following general formula (7) (hereinafter referred to as "repeating unit (7)"), and the like.

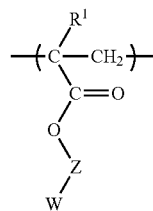
(6)

wherein $R^1$ represents a hydrogen atom, a methyl group, or a trifluoromethyl group, Z represents a single bond or a divalent organic group having 1 to 3 carbon atoms, and W represents a substituted or unsubstituted polyalicyclic hydrocarbon group having 7 to 20 carbon atoms. The polyalicyclic hydrocarbon group may be substituted with a linear or branched alkyl group having 1 to 10 carbon atoms, a cyclic alkyl group having 4 to 20 carbon atoms, a hydroxyl group, a cyano group, a hydroxyalkyl group having 1 to 10 carbon atoms, a carboxyl group, or an oxo group.

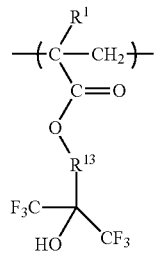
(7)

wherein $R^{12}$ represents a hydrogen atom, an alkyl group having 1 to 4 carbon atoms, a trifluoromethyl group, or a hydroxylmethyl group, and $R^{13}$ represents a divalent organic group.

Examples of the substituted or unsubstituted polyalicyclic hydrocarbon group having 7 to 20 carbon atoms represented by W in the repeating unit (6) include hydrocarbon groups derived from cycloalkanes such as bicyclo[2.2.1]heptane (6a), bicyclo[2.2.2]octane (6b), tricyclo[5.2.1.0$^{2,6}$]decane (6c), tetracyclo[6.2.1.1$^{3,6}$.0$^{2,7}$]dodecane (6d), and tricyclo[3.3.1.1$^{3,7}$]decane (6e) (see the following formulas), and the like.

(6a)

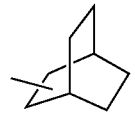
(6b)

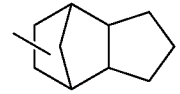
(6c)

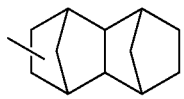
(6d)

(6e)

Examples of a substituent for the hydrocarbon group derived from a cycloalkane include linear or branched alkyl groups having 1 to 10 carbon atoms, such as a methyl group, an ethyl group, an n-propyl group, an i-propyl group, an n-butyl group, a 2-methylpropyl group, a 1-methylpropyl group, and a t-butyl group, cyclic alkyl groups having 4 to 20 carbon atoms, such as a cyclopentyl group, a cyclohexyl group, and a cyclooctyl group, and the like. Note that the substituent is not limited to these alkyl groups. The hydrocarbon group may be substituted with a hydroxyl group, a cyano group, a hydroxyalkyl group having 1 to 10 carbon atoms, a carboxyl group, or an oxo group.

Examples of the alkyl group having 1 to 4 carbon atoms represented by $R^{12}$ in the general formula (7) include a methyl group, an ethyl group, an n-propyl group, an i-propyl group, an n-butyl group, a 2-methylpropyl group, a 1-methylpropyl group, a t-butyl group, and the like.

The divalent organic group represented by $R^{13}$ in the general formula (7) is preferably a divalent hydrocarbon group, and more preferably a chain-like or cyclic divalent hydrocarbon group. The divalent organic group may be an alkylene glycol group, an alkylene ester group, or the like.

Specific examples of the divalent organic group include saturated chain-like hydrocarbon groups such as a methylene group, an ethylene group, a propylene group (e.g. 1,3-propylene group, 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosalene group, a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a propylidene group, and a 2-propylidene group;

monocyclic hydrocarbon groups such as cycloalkylene groups having 3 to 10 carbon atoms, e.g., a cyclobutylene group such as a 1,3-cyclobutylene group, a cyclopentylene group such as a 1,3-cyclopentylene group, a cyclohexylene group such as a 1,4-cyclohexylene group, and a cyclooctylene group such as a 1,5-cyclooctylene group; bridged cyclic hydrocarbon groups such as cyclic hydrocarbon groups having 2 to 4 rings and 4 to 30 carbon atoms, e.g., a norbornylene group such as a 1,4-norbornylene group and a 2,5-norbornylene group, and an adamantylene group such as a 1,5-adamantylene group and a 2,6-adamantylene group; and the like. Among these, a hydrocarbon group that includes a 2,5-norbornylene group, an ethylene group, and a propylene group are preferable.

When $R^{13}$ includes a divalent alicyclic hydrocarbon group, it is preferable that an alkylene group having 1 to 4 carbon atoms (i.e., spacer) be interposed between the bistrifluoromethyl-hydroxyl-methyl group ($-C(CF_3)_2OH$) and the divalent alicyclic hydrocarbon group.

Further examples of the additional repeating unit include units obtained by cleavage of a polymerizable unsaturated bond of a carboxyl group-containing ester that includes a bridged hydrocarbon skeleton of an unsaturated carboxylic acid, a (meth)acrylate that does not include a bridged hydrocarbon skeleton, a carboxyl group-containing ester that does not include a bridged hydrocarbon skeleton of an unsaturated carboxylic acid, a polyfunctional monomer that includes a bridged hydrocarbon skeleton, a polyfunctional monomer that does not include a bridged hydrocarbon skeleton, or the like. Among these, a unit obtained by cleavage of a polymerizable unsaturated bond of a (meth)acrylate that includes a bridged hydrocarbon skeleton, and the like are preferable.

The polymer (A) may include only one type of additional repeating unit, or may include two or more types of additional repeating unit.

(2) Polymer (B)

The polymer (B) includes an acid-labile group and a crosslinkable group. The polymer (B) preferably includes any of the repeating units mentioned above in connection with the polymer (A), and more preferably further includes at least one of a repeating unit shown by the following general formula (3-1) and a repeating unit shown by the following general formula (3-2) (hereinafter referred to as "repeating unit (3)"). Since the first positive-tone radiation-sensitive composition includes the polymer (B), the first resist layer can be dissolved in an alkaline developer due to an acid, and can be insolubilized in the second positive-tone radiation-sensitive composition by heating or exposure.

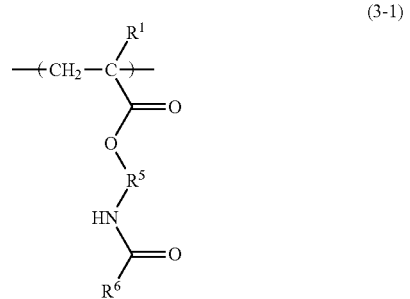

(3-1)

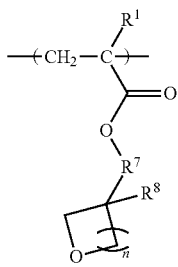

(3-2)

wherein $R^1$ represents a hydrogen atom, a methyl group, or a trifluoromethyl group, $R^5$ represents a methylene group, an ethylene group, or a propylene group, $R^6$ represents a group shown by the following general formula (4) or a group shown by the following general formula (5), $R^7$ represents a methylene group or an alkylene group having 2 to 6 carbon atoms, $R^8$ represents a hydrogen atom, a methyl group, or an ethyl group, and n is 0 or 1.

(4)

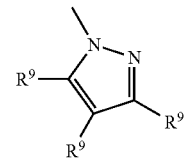

(5)

wherein $R^9$ individually represent a hydrogen atom or a linear or branched alkyl group having 1 to 10 carbon atoms.

The content of the polymer (B) is normally 1 to 80 parts by mass, and preferably 2 to 50 parts by mass, based on 100 parts by mass of the polymer (A). If the content of the polymer (B) is less than 1 part by mass, the first resist layer may not exhibit sufficient resistance to the second resist layer. If the content of the polymer (B) is more than 80 parts by mass, a decrease in resolution may occur when forming the first resist pattern.

(3) Polymer (F)

The positive-tone radiation-sensitive composition according to one embodiment of the invention preferably further includes (F) a polymer that includes at least one of a repeating unit shown by the following general formula (10) and a repeating unit shown by the following general formula (11). Since the polymer (F) includes a fluorine site in its structure, the distribution of the polymer (F) tends to increase near the surface of a resist film formed using the positive-tone radiation-sensitive composition due to the oil repellency of the polymer (F) included in the resist film. This suppresses elution of the acid generator, an acid diffusion controller, and the like included in the resist film into an immersion liquid (e.g., water) during liquid immersion lithography. Moreover, the receding contact angle formed by the resist film and the immersion liquid increases due to the water repellency of the polymer (F). Therefore, waterdrops of the immersion liquid rarely remain on the resist film, so that occurrence of defects (e.g., watermark defects) due to the immersion liquid can be suppressed even when high-speed scanning exposure is performed.

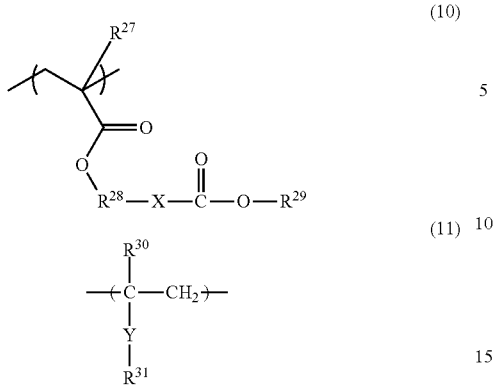

(10)

(11)

wherein $R^{27}$ represents a hydrogen atom, a methyl group, or a trifluoromethyl group, $R^{28}$ represents a single bond or a linear, branched, or cyclic saturated or unsaturated divalent hydrocarbon group having 1 to 20 carbon atoms, X represents a methylene group substituted with a fluorine atom or a linear or branched fluoroalkylene group having 2 to 20 carbon atoms, $R^{29}$ represents a hydrogen atom or a monovalent organic group, $R^{30}$ represents a hydrogen atom, a methyl group, or a trifluoromethyl group, Y represents a linking group, and $R^{31}$ represents a linear or branched alkyl group having 1 to 6 carbon atoms that is substituted with at least one fluorine atom, an alicyclic hydrocarbon group having 4 to 20 carbon atoms that is substituted with at least one fluorine atom, or a derivative thereof.

Examples of the linear or branched saturated or unsaturated divalent hydrocarbon group having 1 to 20 carbon atoms represented by $R^{28}$ in the general formula (10) include divalent hydrocarbon groups derived from a linear or branched alkyl group having 1 to 20 carbon atoms (e.g., methyl group, ethyl group, n-propyl group, i-propyl group, n-butyl group, 2-methylpropyl group, 1-methylpropyl group, t-butyl group, pentyl group, isopentyl group, neopentyl group, hexyl group, heptyl group, octyl group, nonyl group, and decyl group), and the like.

Examples of the cyclic saturated or unsaturated divalent hydrocarbon group include groups derived from an alicyclic hydrocarbon having 3 to 20 carbon atoms or an aromatic hydrocarbon. Specific examples of the alicyclic hydrocarbon include cycloalkanes such as cyclobutane, cyclopentane, cyclohexane, bicyclo[2.2.1]heptane, bicyclo[2.2.2]octane, tricyclo[5.2.1.0$^{2,6}$]decane, tricyclo[3.3.1.1$^{3,7}$]decane, and tetracyclo[6.2.1.1$^{3,6}$.0$^{2,7}$]dodecane, and the like. Examples of the aromatic hydrocarbon include benzene, naphthalene, and the like.

The hydrocarbon group may be a group obtained by substituting at least one hydrogen atom of the unsubstituted hydrocarbon group with at least one of a linear, branched, or cyclic alkyl group having 1 to 12 carbon atoms, such as a methyl group, an ethyl group, an n-propyl group, an i-propyl group, an n-butyl group, a 2-methylpropyl group, a 1-methylpropyl group, or a t-butyl group, a hydroxyl group, a cyano group, a hydroxyalkyl group having 1 to 10 carbon atoms, a carboxyl group, an oxygen atom, and the like.

Specific examples of the group represented by $R^{28}$ in the general formula (10) include groups having the following structures (a1) to (a27) and the like. Note that "*" in the structures (a1) to (a27) indicates a bonding site.

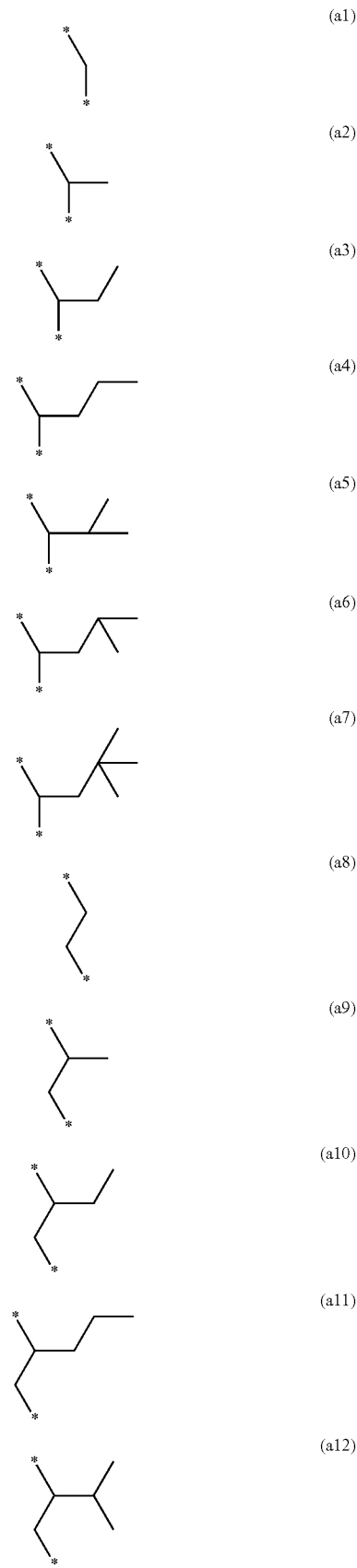

(a1)

(a2)

(a3)

(a4)

(a5)

(a6)

(a7)

(a8)

(a9)

(a10)

(a11)

(a12)

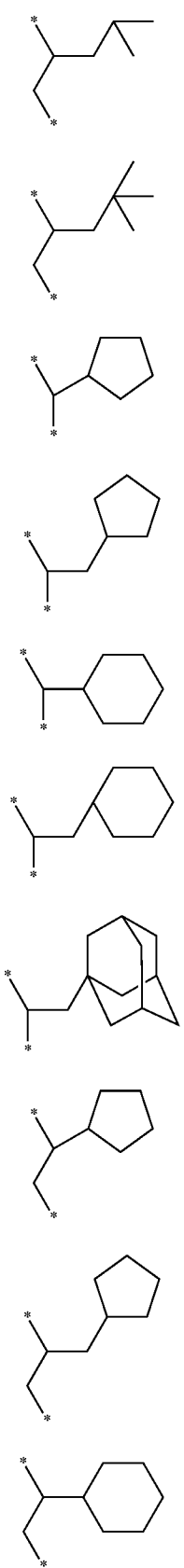
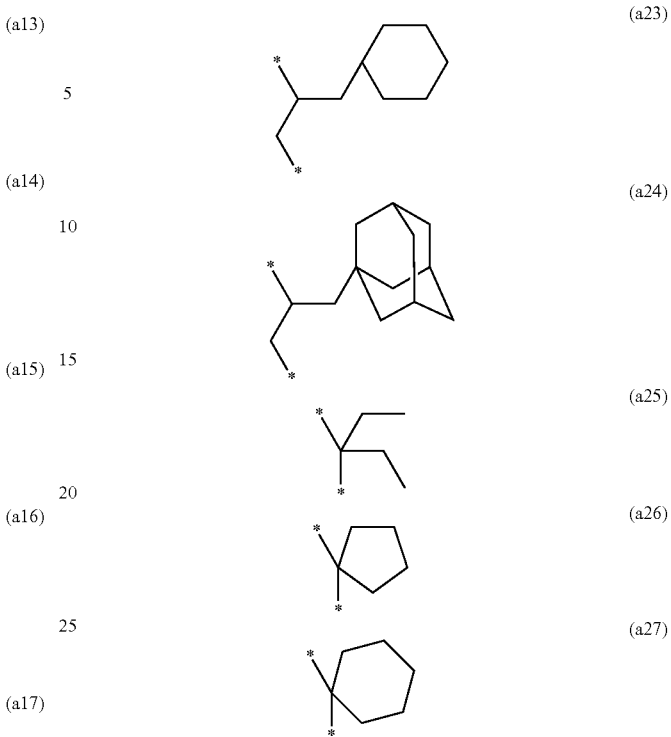

R²⁸ in the general formula (10) preferably represents a methylene group, an ethylene group, a 1-methylethylene group, a 2-methylethylene group, a divalent alicyclic hydrocarbon group having 4 to 20 carbon atoms, a group derived therefrom, or the like.

Examples of the monovalent organic group represented by $R^{29}$ in the general formula (10) include an acid-dissociable group and a monovalent hydrocarbon group having 1 to 20 carbon atoms (excluding a group that corresponds to the acid-dissociable group). The term "acid-dissociable group" used herein refers to a group that substitutes the hydrogen atom of a carboxyl group, and dissociates in the presence of an acid. Examples of the acid-dissociable group include a t-butoxycarbonyl group, a tetrahydropyranyl group, a tetrahydrofuranyl group, a (thiotetrahydropyranylsulfanyl)methyl group, a (thiotetrahydrofuranylsulfanyl)methyl group, an alkoxy-substituted methyl group, an alkylsulfanyl-substituted methyl group, and the like. Examples of the substituent for the alkoxy-substituted methyl group include alkoxy groups having 1 to 4 carbon atoms. Examples of the alkyl group (substituent) for the alkylsulfanyl-substituted methyl group include alkyl groups having 1 to 4 carbon atoms.

Further examples of the acid-dissociable group include a group shown by the general formula (17): —C(R)₃. R in the general formula (17) individually represent a linear or branched alkyl group having 1 to 4 carbon atoms, a monovalent alicyclic hydrocarbon group having 4 to 20 carbon atoms, or a group derived therefrom, or two of R bond to form a divalent alicyclic hydrocarbon group having 4 to 20 carbon atoms, or a group derived therefrom, together with the carbon atom that is bonded thereto, and the remaining R represents a linear or branched alkyl group having 1 to 4 carbon atoms, a monovalent alicyclic hydrocarbon group having 4 to 20 carbon atoms, or a group derived therefrom.

Examples of the linear or branched alkyl group having 1 to 4 carbon atoms represented by R in the general formula (17)

include a methyl group, an ethyl group, an n-propyl group, an i-propyl group, an n-butyl group, a 2-methylpropyl group, a 1-methylpropyl group, a t-butyl group, and the like. Examples of the monovalent alicyclic hydrocarbon group having 4 to 20 carbon atoms include a group that includes an alicyclic ring derived from a cycloalkane (e.g., norbornane, tricyclodecane, tetracyclododecane, adamantane, cyclobutane, cyclopentane, cyclohexane, cycloheptane, or cyclooctane), and the like. Examples of a group derived from the alicyclic hydrocarbon group include a group obtained by substituting the monovalent alicyclic hydrocarbon group with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group, and the like. Among these, an alicyclic hydrocarbon group that includes an alicyclic ring derived from norbornane, tricyclodecane, tetracyclododecane, adamantane, cyclopentane, or cyclohexane, a group obtained by substituting the alicyclic hydrocarbon group with any of the above alkyl groups, and the like are preferable.

Examples of the divalent alicyclic hydrocarbon group having 4 to 20 carbon atoms that is formed by two of R together with the carbon atom bonded thereto (i.e., the carbon atom bonded to the oxygen atom) include monocyclic hydrocarbon groups such as a cyclobutylene group, a cyclopentylene group, a cyclohexylene group, and a cyclooctylene group, polynuclear hydrocarbon groups such as a norbornylane group, a tricyclodecanylene group, and a tetracyclodecanylene group, and crosslinked polycyclic hydrocarbon groups such as an adamantylene group. Examples of a group derived from the divalent alicyclic hydrocarbon group formed by two of R include a group obtained by substituting the divalent alicyclic hydrocarbon group with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group, and the like. Among these, monocyclic hydrocarbon groups such as a cyclopentylene group and a cyclohexylene group, a group obtained by substituting the divalent alicyclic hydrocarbon group (monocyclic hydrocarbon group) with any of the above alkyl groups, and the like are preferable.

Examples of a preferable acid-dissociable group shown by the general formula (17) include a t-butyl group, a 1-n-(1-ethyl-1-methyl)propyl group, a 1-n-(1,1-dimethyl)propyl group, a 1-n-(1,1-dimethyl)butyl group, a 1-n-(1,1-dimethyl)pentyl group, 1-(1,1-diethyl)propyl group, a 1-n-(1,1-diethyl)butyl group, a 1-n-(1,1-diethyl)pentyl group, a 1-(1-methyl)cyclopentyl group, a 1-(1-ethyl)cyclopentyl group, a 1-(1-n-propyl)cyclopentyl group, a 1-(1-i-propyl)cyclopentyl group, a 1-(1-methyl)cyclohexyl group, a 1-(1-ethyl)cyclohexyl group, a 1-(1-n-propyl)cyclohexyl group, a 1-(1-i-propyl)cyclohexyl group, a 1-{1-methyl-1-(2-norbornyl)}ethyl group, a 1-{1-methyl-1-(2-tetracyclodecanyl)}ethyl group, a 1-{1-methyl-1-(1-adamantyl)}ethyl group, a 2-(2-methyl)norbornyl group, a 2-(2-ethyl)norbornyl group, a 2-(2-n-propyl)norbornyl group, a 2-(2-i-propyl)norbornyl group, a 2-(2-methyl)tetracyclodecanyl group, a 2-(2-ethyl) tetracyclodecanyl group, a 2-(2-n-propyl)tetracyclodecanyl group, a 2-(2-i-propyl)tetracyclodecanyl group, a 1-(1-methyl)adamantyl group, a 1-(1-ethyl)adamantyl group, a 1-(1-n-propyl)adamantyl group, a 1-(1-i-propyl)adamantyl group, a group obtained by substituting the above group with at least one linear, branched, or cyclic alkyl group having 1 to 4 carbon atoms, such as a methyl group, an ethyl group, a n-propyl group, an i-propyl group, an n-butyl group, a 2-methylpropyl group, a 1-methylpropyl group, or a t-butyl group, and the like.

Among these, the group shown by the general formula (17), a t-butoxycarbonyl group, an alkoxy-substituted methyl group, and the like are preferable, and an alkoxy-substituted methyl group and the group shown by the general formula (17) are particularly preferable.

Examples of the methylene group substituted with a fluorine atom or the linear or branched fluoroalkylene group having 2 to 20 carbon atoms represented by X in the general formula (10) include the structures shown by the following formulas (X-1) to (X-8), and the like.

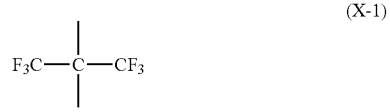

(X-1)

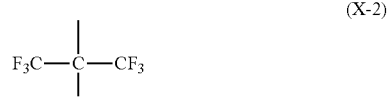

(X-2)

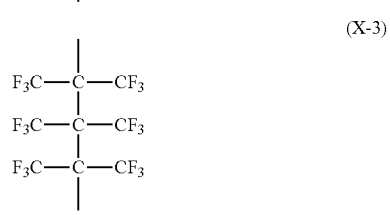

(X-3)

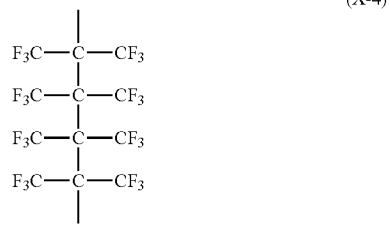

(X-4)

(X-5)

(X-6)

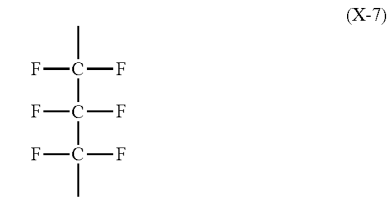

(X-7)

-continued

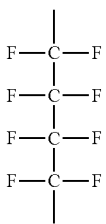
(X-8)

The repeating unit (10) is preferably a repeating unit derived from one of the compounds shown by the following formulas (10-1) to (10-6).

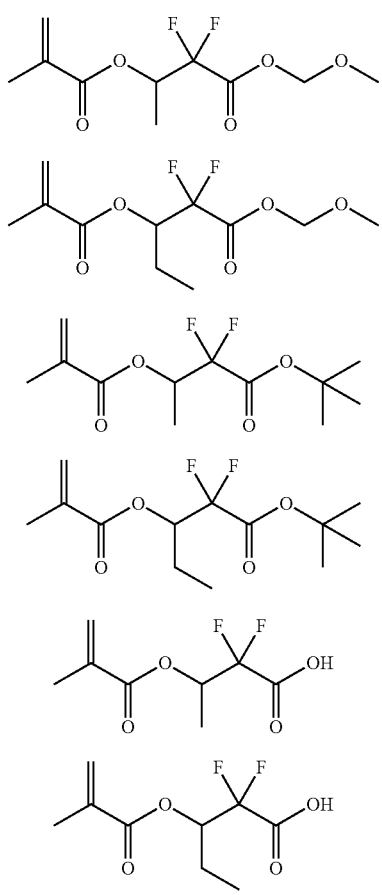

The polymer (F) may include only one type of repeating unit (10), or may include two or more types of repeating unit (10).

Examples of the linking group represented by A in the general formula (11) include a single bond, an oxygen atom, a sulfur atom, a carbonyloxy group, an oxycarbonyl group, an amide group, a sulfonylamide group, a urethane group, and the like.

Examples of the linear or branched alkyl group having 1 to 6 carbon atoms that is substituted with at least one fluorine atom represented by $R^{31}$ in the general formula (11) include groups obtained by partial fluorination of a linear or branched alkyl group (e.g., methyl group, ethyl group, 1-propyl group, 2-propyl group, 1-butyl group, 2-butyl group, 2-(2-methylpropyl) group, 1-pentyl group, 2-pentyl group, 3-pentyl group, 1-(2-methylbutyl) group, 1-(3-methylbutyl) group, 2-(2-methylbutyl) group, 2-(3-methylbutyl) group, neopentyl group, 1-hexyl group, 2-hexyl group, 3-hexyl group, 1-(2-methylpentyl) group, 1-(3-methylpentyl) group, 1-(4-methylpentyl) group, 2-(2-methylpentyl) group, 2-(3-methylpentyl) group, 2-(4-methylpentyl) group, 3-(2-methylpentyl) group, and 3-(3-methylpentyl) group), a perfluoroalkyl group derived therefrom, and the like.

Examples of the monovalent alicyclic hydrocarbon group having 4 to 20 carbon atoms that is substituted with at least one fluorine atom, or a derivative thereof, include groups obtained by partial fluorination of an alicyclic alkyl group (e.g., cyclopentyl group, cyclopentylmethyl group, 1-(1-cyclopentylethyl) group, 1-(2-cyclopentylethyl) group, cyclohexyl group, cyclohexylmethyl group, 1-(1-cyclohexylethyl) group, 1-(2-cyclohexylethyl) group, cycloheptyl group, cycloheptylmethyl group, 1-(1-cycloheptylethyl) group, 1-(2-cycloheptylethyl) group, and 2-norbornyl group), a perfluoroalkyl group derived therefrom, and the like.

Examples of a preferable monomer that produces the repeating unit (11) include trifluoromethyl (meth)acrylate, 2,2,2-trifluoroethyl (meth)acrylate, perfluoroethyl (meth)acrylate, perfluoro-n-propyl (meth)acrylate, perfluoro-i-propyl (meth)acrylate, perfluoro-n-butyl (meth)acrylate, perfluoro-1-butyl (meth)acrylate, perfluoro t-butyl (meth)acrylate, 2-(1,1,1,3,3,3-hexafluoropropyl) (meth)acrylate, 1-(2,2,3,3,4,4,5,5-octafluoropentyl) (meth)acrylate, perfluorocyclohexylmethyl (meth)acrylate, 1-(2,2,3,3,3-pentafluoropropyl) (meth)acrylate, 1-(3,3,4,4,5,5,6,6,7,7,8,8,9,9,10,10,10-heptadecafluorodecyl) (meth)acrylate, 1-(5-trifluoromethyl-3,3,4,4,5,6,6,6-octafluorohexyl) (meth)acrylate, and the like.

The polymer (F) may include only one type of repeating unit (11), or may include two or more types of repeating unit (11). The content of the repeating unit (11) is normally 5 mol % or more, preferably 10 mol % or more, and more preferably 15 mol % or more, based on the total amount (=100 mol %) of the repeating units included in the polymer (F). If the content of the repeating unit (11) is less than 5 mol %, a receding contact angle of 70° or more may not be achieved, or elution of the acid generator and the like from the resist film may not be suppressed.

(Content of Repeating Unit Included in Polymer)

The content of the repeating unit (1) in each polymer is preferably 10 to 90 mol %, more preferably 10 to 80 mol %, and still more preferably 20 to 70 mol %, based on the total amount (=100 mol %) of the repeating units included in each polymer. If the content of the repeating unit (1) is less than 10 mol %, the resolution of the alkali-developable area may deteriorate. If the content of the repeating unit (1) is more than 90 mol %, the developability of the alkali-developable area may deteriorate.

The content of the repeating unit (2) in each polymer is preferably 5 to 70 mol %, more preferably 5 to 65 mol %, and still more preferably 10 to 60 mol %, based on the total amount (=100 mol %) of the repeating units included in each polymer. If the content of the repeating unit (2) is less than 5 mol %, the developability of the resulting resist and the process margin may decrease.

The content of the repeating unit (3) in the polymer (B) is preferably 1 to 30 mol %, and more preferably 1 to 25 mol %, based on the total amount (=100 mol %) of the repeating units included in the polymer (B). If the content of the repeating unit (3) is more than 30 mol %, the alkali-developable area may swell due to an alkaline developer, or the solubility of the polymer (B) in an alkaline developer may decrease.

The content of the repeating unit (7) in each polymer is preferably 30 mol % or less, and more preferably 25 mol % or less, based on the total amount (=100 mol %) of the repeating units included in each polymer. If the content of the repeating unit (7) is more than 30 mol %, the top of the resist pattern may be lost, so that the pattern shape may deteriorate.

The first positive-tone radiation-sensitive composition may include only one type of each polymer, or may include two or more of types of each polymer.

(Production of Polymer)

Each polymer may be prepared by polymerizing polymerizable unsaturated monomers that produce the respective repeating units in an appropriate solvent optionally in the presence of a chain transfer agent using a radical initiator such as a hydroperoxide, a dialkyl peroxide, a diacyl peroxide, or an azo compound, for example.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ketones such as acetone, 2-butanone, 4-methyl-2-pentanone, and 2-heptanone; ethers such as tetrahydrofuran, dimethoxyethanes, and diethoxyethanes; and the like. These solvents may be used either individually or in combination.

(Properties of Polymer)

The polystyrene-reduced weight average molecular weight (Mw) of each polymer determined by gel permeation chromatography (GPC) is not particularly limited, but is preferably 1000 to 100,000, more preferably 1000 to 30,000, and still more preferably 1000 to 20,000. If the Mw of each polymer is less than 1000, the heat resistance of the first resist layer may decrease. If the Mw of each polymer is more than 100,000, the developability of the alkali-developable area may deteriorate.

The ratio (Mw/Mn) of the Mw to the polystyrene-reduced number average molecular weight (Mn) of each polymer determined by gel permeation chromatography (GPC) is normally 1 to 5, and preferably 1 to 3.

Each polymer may include low-molecular-weight components derived from the monomers used to produce each polymer. The content (solid content) of low-molecular-weight components in each polymer is preferably 0.1 mass % or less, more preferably 0.07 mass % or less, and still more preferably 0.05 mass % or less. If the content of low-molecular-weight components is 0.1 mass % or less, the elution volume upon contact with an immersion liquid (e.g., water) during liquid immersion lithography can be reduced. Moreover, it is possible to prevent production of foreign substances during storage of the resist, prevent uneven resist application, and sufficiently suppress occurrence of defects when forming a resist pattern.

The term "low-molecular-weight component" used herein refers to a component having an Mw of 500 or less. Examples of low-molecular-weight components include a monomer, a dimer, a trimer, and an oligomer. Low-molecular-weight components may be removed by chemical purification (e.g., washing with water or liquid-liquid extraction), or a combination of chemical purification and physical purification (e.g., ultrafiltration or centrifugation), for example. The content of low-molecular-weight components may be determined by high-performance liquid chromatography (HPLC).

It is preferable that each polymer have a low impurity (e.g., halogen or metal) content. The sensitivity, the resolution, the process stability, the pattern shape, and the like of the first resist layer can be improved by reducing the impurity content.

Each polymer may be purified by chemical purification (e.g., washing with water or liquid-liquid extraction), or a combination of chemical purification and physical purification (e.g., ultrafiltration or centrifugation), for example.

(4) Acid Generator (C)

The acid generator (C) generates an acid upon exposure. When the first positive-tone radiation-sensitive composition includes the acid generator (C), the acid-dissociable group of the repeating unit (1) included in the polymer dissociates (i.e., the protecting group is eliminated) due to the acid generated by the acid generator (C) upon exposure, so that the alkali-developable area becomes readily soluble in an alkaline developer to obtain a positive-tone resist pattern. The acid generator (C) preferably includes a compound shown by the following general formula (9) (hereinafter referred to as "acid generator (1)"). The acid generator (C) may include only one type of acid generator (1), or may include two or more types of acid generator (1).

(i) Acid Generator (1)

The acid generator (1) is shown by the following general formula (9).

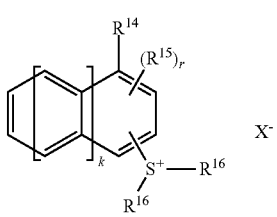

(9)

wherein $R^{14}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, $R^{15}$ represents a linear or branched alkyl group having 1 to 10 carbon atoms, a linear or branched alkoxy group having 1 to 10 carbon atoms, or a linear, branched, or cyclic alkanesulfonyl group having 1 to 10 carbon atoms, $R^{16}$ individually represent a linear or branched alkyl group having 1 to 10 carbon atoms, a substituted or unsubstituted phenyl group, or a substituted or unsubstituted naphthyl group, or bond to form a substituted or unsubstituted divalent group having 2 to 10 carbon atoms that includes a sulfur cation, k is an integer from 0 to 2, r is an integer from 0 to 10 (preferably an integer from 0 to 2), and $X^-$ represents one of anions shown by the following general formulas (12-1) to (12-4).

(12-1)

(12-2)

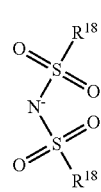
(12-3)

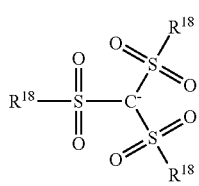
(12-4)

wherein $R^{17}$ represents a fluorine atom or a substituted or unsubstituted hydrocarbon group having 1 to 12 carbon atoms, q is an integer from 1 to 10, and $R^{18}$ individually represent a linear or branched alkyl group having 1 to 10 carbon atoms that is substituted with a fluorine atom, or bond to form a divalent organic group having 2 to 10 carbon atoms that is substituted with a fluorine atom and may include a substituent other than a fluorine atom.

The acid generator (C) may include a photoacid generator (hereinafter referred to as "acid generator (2)") other than the acid generator (1).

(ii) Acid Generator (2)

Examples of the acid generator (2) include onium salt compounds, halogen-containing compounds, diazoketone compounds, sulfone compounds, sulfonic acid compounds, and the like. The acid generator (C) may include only one type of acid generator (2), or may include two or more types of acid generator (2).

The content of the acid generator (C) is normally 0.1 to 20 parts by mass, and preferably 0.5 to 10 parts by mass, based on 100 parts by mass of the polymer (A) so that the resulting resist exhibits excellent sensitivity and developability. If the content of the acid generator (C) is less than 0.1 parts by mass, the sensitivity and the developability of the resulting resist may decrease. If the content of the acid generator (C) is more than 20 parts by mass, the transparency to radiation of the resulting resist may decrease, so that a rectangular resist pattern may not be obtained.

The content of the acid generator (2) is 80 mass % or less, and preferably 60 mass % or less, based on the total amount (=100 mass %) of the acid generator (C).

(5) Solvent (D)

Examples of the solvent (D) include linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and the like.

Among these, linear or branched ketones, cyclic ketones, propylene glycol monoalkyl ether acetates, alkyl 2-hydroxypropionates, alkyl 3-alkoxypropionates, γ-butyrolactone, and the like are preferable.

The first positive-tone radiation-sensitive composition may include only one type of solvent (D), or may include two or more of types of solvent (D).

The solvent (D) is normally used in such an amount that the solid content of the first positive-tone radiation-sensitive composition is 1 to 50 mass %, and preferably 1 to 25 mass %.

(6) Additive

The first positive-tone radiation-sensitive composition may optionally include various additives such as an acid diffusion controller, an aliphatic additive, a surfactant, and a sensitizer.

(i) Acid diffusion Controller

The acid diffusion controller controls diffusion of an acid generated by the acid generator (C) upon exposure within the first resist layer, and suppresses undesired chemical reactions in the unexposed area. The storage stability of the first positive-tone radiation-sensitive composition is improved by adding the acid diffusion controller. Moreover, the acid diffusion controller further improves the resolution of the resulting resist, and suppresses a change in line width of the resist pattern due to a variation in post-exposure delay (PED), so that a composition that exhibits excellent process stability can be obtained.

Examples of the acid diffusion controller include amine compounds, amide group-containing compounds, urea compounds, nitrogen-containing heterocyclic compounds, and the like.

(Amine Compound)

Examples of a preferable amine compound include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)

alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; substituted alkylamines such as 2,2',2"-nitrotriethanol; anilines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline, and derivatives thereof; ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2'-bis (4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis (2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N",N"'-pentamethyldiethylenetriamine, and the like.

(Amide Group-containing Compound)

Examples of a preferable amide group-containing compound include N-t-butoxycarbonyl group-containing amino compounds such as N-t-butoxycarbonyldi-n-octylamine, N-t-butoxycarbonyldi-n-nonylamine, N-t-butoxycarbonyl-di-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N-t-butoxycarbonylpiperidine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminonooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanurate, and the like.

(Urea Compound)

Examples of a preferable urea compound include urea, methylurea, 1,1-dimethylurea, 1,3-dimethylurea, 1,1,3,3-tetramethylurea, 1,3-diphenylurea, tri-n-butylthiourea, and the like.

(Nitrogen-containing Heterocyclic Compound)

Examples of a preferable nitrogen-containing heterocyclic compound include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxyquinoline, acridine, and 2,2':6',2"-terpyridine; piperazines such as piperazine and 1-(2-hydroxyethyl)piperazine; and pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

A photodegradable base that generates a base upon exposure may also be used as the acid diffusion controller.

(Photodegradable Base)

Examples of the photodegradable base include an onium salt compound that loses acid-diffusion controllability upon decomposition due to exposure. Specific examples of the onium salt compound include a sulfonium salt compound shown by the following general formula (13) and an iodonium salt compound shown by the following general formula (14).

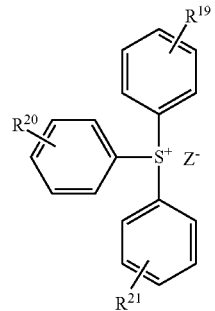

(13)

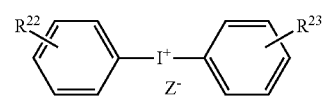

(14)

wherein $R^{19}$ to $R^{21}$, $R^{22}$, and $R^{23}$ individually represent a hydrogen atom, an alkyl group, an alkoxy group, a hydroxyl group, or a halogen atom, and $Z^-$ represents $OH^-$, $R^{24}$—$COO^-$, $R^{24}$—$SO_3^-$ (wherein $R^{24}$ represents an alkyl group, an aryl group, or an alkaryl group), or an anion shown by the following general formula (15).

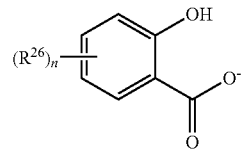

(15)

wherein $R^{26}$ represents a linear or branched alkyl group having 1 to 12 carbon atoms that may be substituted with a fluorine atom, or a linear or branched alkoxy group having 1 to 12 carbon atoms, and n is 1 or 2.

These acid diffusion controllers may be used either individually or in combination.

The acid diffusion controller is preferably used in an amount of 0.001 to 15 parts by mass, more preferably 0.01 to 10 parts by mass, and still more preferably 0.05 to 5 parts by mass, based on 100 parts by mass of the polymer (A). If the amount of the acid diffusion controller is more than 15 parts by mass, the sensitivity of the resulting resist may decrease. If the amount of the acid diffusion controller is less than 0.001 parts by mass, the shape or the dimensional accuracy of the resist pattern may deteriorate depending on the process conditions.

(ii) Alicyclic Additive

The alicyclic additive further improves the dry etching resistance, the pattern shape, adhesion to a substrate, and the like.

Examples of the alicyclic additive include adamantane derivatives such as 1-adamantanecarboxylic acid, 2-adamantanone, t-butyl-1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-(2-hydroxy-2,2-bis(trifluoromethyl)ethyl)tetracyclo[6.2.1.1$^{3,}$ $_6$.0$^{2,7}$]dodecane; and the like. These alicyclic additives may be used either individually or in combination.

(iii) Surfactant

The surfactant improves applicability, striation, developability, and the like.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination.

(iv) Sensitizer

The sensitizer absorbs the energy of radiation, and transmits the energy to the acid generator (C) so that the amount of acid generated increases. Specifically, the sensitizer improves the apparent sensitivity of the first positive-tone radiation-sensitive composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

(v) Additional Additive

The first positive-tone radiation-sensitive composition may optionally include an additive (hereinafter referred to as "additional additive") other than the above additives. Examples of the additional additive include an alkali-soluble resin, a low-molecular-weight alkali-solubility controller that includes an acid-dissociable protecting group, a halation inhibitor, a preservation stabilizer, an antifoaming agent, and the like. A dye or a pigment visualizes the latent image in the exposed area to reduce the effects of halation during exposure. An adhesion improver improves adhesion to a substrate.

The first positive-tone radiation-sensitive composition may be prepared by dissolving each component in the solvent (D), and filtering the solution through a filter having a pore size of about 0.2 μm, for example. The first positive-tone radiation-sensitive composition thus prepared may be applied to a substrate.

2. Second Positive-tone Radiation-sensitive Composition

The second positive-tone radiation-sensitive composition that is used when forming the second resist layer includes (a) a polymer that becomes alkali-soluble due to an acid (hereinafter referred to as "polymer (a)"), and (b) a solvent.

(1) Polymer (a)

The polymer (a) is insoluble or scarcely soluble in alkali, but becomes alkali-soluble due to an acid. The polymer (a) is not particularly limited insofar as the polymer (a) becomes alkali-soluble due to an acid, but preferably includes a repeating unit shown by the following general formula (16) (hereinafter referred to as "repeating unit (16)"), and the repeating unit (1).

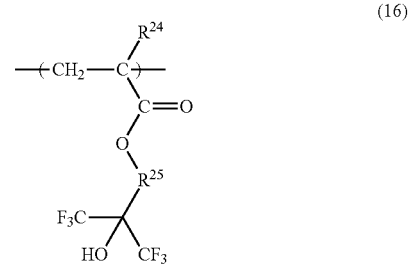

wherein $R^{24}$ represents a hydrogen atom, a methyl group, or a trifluoromethyl group, and $R^{25}$ represents a single bond, a methylene group, a linear or branched alkylene group having 2 to 6 carbon atoms, or an alicyclic alkylene group having 4 to 12 carbon atoms.

(i) Repeating Unit (16)

Examples of a preferable monomer that produces the repeating unit (16) include (1,1,1-trifluoro-2-trifluoromethyl-2-hydroxy-3-propyl) (meth)acrylate, (1,1,1-trifluoro-2-trifluoromethyl-2-hydroxy-4-butyl) (meth)acrylate, (1,1,1-trifluoro-2-trifluoromethyl-2-hydroxy-5-pentyl) (meth)acrylate, (1,1,1-trifluoro-2-trifluoromethyl-2-hydroxy-4-pentyl) (meth)acrylate, 2-((5-(1',1',1'-trifluoro-2'-trifluoromethyl-2'-hydroxy)propyl)bicyclo[2.2.1]heptyl) (meth)acrylate, 3-((8-(1',1',1'-trifluoro-2'-trifluoromethyl-2'-hydroxy)propyl)tetracyclo[6.2.1.1$^{3,6}$.0$^{2,7}$]dodecyl) (meth) acrylate, and the like.

The polymer (a) may include only one type of repeating unit (16), or may include two or more types of repeating unit (16).

(ii) Repeating Unit (1)

The description given above in connection with the repeating unit (1) included in the polymer (A) used for the first positive-tone radiation-sensitive composition applies to the repeating unit (1).

(iii) Additional Repeating Unit

The polymer (a) may further include an additional repeating unit other than the repeating units (16) and (1).

(Content of Repeating Unit Included in Polymer (a))

The content of the repeating unit (16) in the polymer (a) is preferably 30 to 90 mol %, more preferably 30 to 80 mol %, and still more preferably 40 to 80 mol %, based on the total amount (=100 mol %) of the repeating units included in the polymer (a). If the content of the repeating unit (16) is less than 30 mol %, the solubility of the polymer (a) in the solvent (b) may decrease. If the content of the repeating unit (16) is more than 90 mol %, the developability of the alkali-developable area may deteriorate.

The content of the repeating unit (1) in the polymer (a) is preferably 10 to 70 mol %, more preferably 10 to 60 mol %, and still more preferably 20 to 60 mol %, based on the total amount (=100 mol %) of the repeating units included in the polymer (a). If the content of the repeating unit (1) is less than 10 mol %, the resolution of the alkali-developable area may deteriorate. If the content of the repeating unit (1) is more than 70 mol %, the developability of the alkali-developable area may deteriorate.

The content of the additional repeating unit in the polymer (a) is preferably 50 mol % or less, and more preferably 40 mol % or less, based on the total amount (=100 mol %) of the repeating units included in the polymer (a).

The second positive-tone radiation-sensitive composition may include only one type of polymer (a), or may include two or more of types of polymer (a).

(Production of Polymer (a))

The polymer (a) may be produced in the same manner as the polymer (A) or (B) using polymerizable unsaturated monomers that produce the respective repeating units, for example.

(Properties of Polymer (a))

The Mw of the polymer (a) is not particularly limited, but is preferably 1000 to 100,000, more preferably 1000 to 30,000, and still more preferably 1000 to 20,000. If the Mw of the polymer (a) is less than 1000, the heat resistance of the second resist layer may decrease. If the Mw of the polymer (a) is more than 100,000, the developability of the alkali-developable area may deteriorate. The ratio (Mw/Mn) of the Mw to the Mn of the polymer (a) is normally 1 to 5, and preferably 1 to 3.

The polymer (a) may include low-molecular-weight components derived from the monomers used to produce the polymer (a). The content (solid content) of low-molecular-weight components in the polymer (a) is preferably 0.1 mass % or less, more preferably 0.07 mass % or less, and still more preferably 0.05 mass % or less. If the content of low-molecular-weight components is 0.1 mass % or less, the elution volume upon contact with an immersion liquid (e.g., water) during liquid immersion lithography can be reduced. Moreover, it is possible to prevent production of foreign substances during storage of the resist, prevent uneven resist application, and sufficiently suppress occurrence of defects when forming a resist pattern.

It is preferable that the polymer (a) have a low impurity (e.g., halogen or metal) content. The sensitivity, the resolution, the process stability, the pattern shape, and the like of the second resist layer can be improved by reducing the impurity content. The polymer (a) may be purified by the above method.

(2) Solvent (b)

The solvent (b) is not particularly limited, but is preferably a compound that dissolves the polymer (a), but does not dissolve the first resist pattern. Examples of such a compound include propylene glycol monomethyl ether acetate, cyclohexanone, and the like.

The solvent (d) is normally used in such an amount that the solid content of the second positive-tone radiation-sensitive composition is 1 to 50 mass %, and preferably 1 to 25 mass %.

(3) Photoacid Generator

The second positive-tone radiation-sensitive composition normally includes a photoacid generator. The description given above in connection with the acid generator (C) used for the first positive-tone radiation-sensitive composition applies to the photoacid generator. The acid generator (C) included in the first positive-tone radiation-sensitive composition and the acid generator included in the second positive-tone radiation-sensitive composition may be either the same or different.

The content of the acid generator is normally 0.1 to 20 parts by mass, and preferably 0.5 to 10 parts by mass, based on 100 parts by mass of the polymer (a) so that the resulting resist exhibits excellent sensitivity and developability. If the content of the acid generator is less than 0.1 parts by mass, the sensitivity and the developability of the resulting resist may decrease. If the content of the acid generator is more than 20 parts by mass, it may be difficult to obtain a rectangular second resist pattern due to a decrease in transparency to radiation.

When the photoacid generator includes the acid generator (1) and an additional acid generator, the additional acid generator is used in an amount of 80 mass % or less, and preferably 60 mass % or less, based on the total amount (=100 mass %) of the photoacid generator.

(4) Additive

The second positive-tone radiation-sensitive composition may include an additive. The above additives (e.g., acid diffusion controller) used for the first positive-tone radiation-sensitive composition may also be used for the second positive-tone radiation-sensitive composition.

When the second positive-tone radiation-sensitive composition includes an acid diffusion controller, the content of the acid diffusion controller is preferably 0.001 to 15 parts by mass, more preferably 0.01 to 10 parts by mass, and still more preferably 0.05 to 5 parts by mass, based on 100 parts by mass of the polymer (a). If the content of the acid diffusion controller is more than 15 parts by mass, the sensitivity of the resulting resist may decrease. If the content of the acid diffusion controller is less than 0.001 parts by mass, the shape or the dimensional accuracy of the resist pattern may deteriorate depending on the process conditions.

The second positive-tone radiation-sensitive composition may be prepared by dissolving each component in the solvent (b), and filtering the solution through a filter having a pore size of about 0.2 µm, for example. The second positive-tone radiation-sensitive composition thus prepared may be applied to a substrate.

The embodiments of the invention are further described below by way of examples. Note that the embodiments of the invention are not limited to the following examples. In the examples and comparative examples, the units "parts" and "%" respectively refer to "parts by mass" and "mass %", unless otherwise indicated. The following property measurement and evaluation methods were used.

Weight average molecular weight (Mw) and number average molecular weight (Mn): The Mw and the Mn of each polymer were measured by gel permeation chromatography (GPC) using GPC columns (manufactured by Tosoh Corp., G2000HXL×2, G3000HXL×1, G4000HXL×1) at a flow rate of 1.0 ml/min and a column temperature of 40° C. (eluant: tetrahydrofuran, standard: monodispersed polystyrene).

$^{13}$C-NMR analysis: Each polymer was subjected to $^{13}$C-NMR analysis using an instrument "JNM-EX270" (manufactured by JEOL Ltd.).

Receding contact angle (°): The positive-tone radiation-sensitive composition was spin-coated onto an Si substrate using a coater/developer "CLEAN TRACK ACTS", and pre-baked (PB) at 100° C. for 60 seconds to form a film having a thickness of 100 nm. The receding contact angle was immediately measured by the following method at a temperature of 23° C. (room temperature) and a humidity of 45% under atmospheric pressure using a contact angle meter "DSA-10" (manufactured by KRUS). Specifically, the position of the wafer stage of the contact angle meter was adjusted, and the substrate was placed on the stage. After injecting water into the needle, the position of the needle was adjusted to the initial position at which a waterdrop can be formed on the substrate. Water was discharged from the needle to form a waterdrop (25 μl) on the substrate. After removing the needle, the needle was moved downward to the initial position, and introduced into the waterdrop. The waterdrop was sucked through the needle for 90 seconds at a rate of 10 μl/min, and the contact angle formed by the liquid surface and the substrate was measured every second (90 times in total). The average value of twenty contact angle measured values (20 seconds) after the measured value became stable was calculated, and taken as the receding contact angle.

Change in contact angle with developer before and after PEB: A substrate to which the positive-tone radiation-sensitive composition was applied was prepared as described above. The contact angle with a developer was measured as described in the section entitled "Measurement of contact angle with developer". After preparing a substrate to which the positive-tone radiation-sensitive composition was applied, the resulting film was exposed via a 6% HT mask using an ArF excimer laser exposure system ("NSR S306C" manufactured by Nikon Corp.) (NA=0.75, sigma=0.85, ½ Annular). The film was then post-baked (PEB) at 95° C. for 60 seconds. The receding contact angle was immediately measured as described in the section entitled "Measurement of contact angle with developer". The difference between the contact angle before PEB and the contact angle after PEB (Δ[(contact angle before PEB)−(contact angle after PEB)]) was calculated using the measurement results, and evaluated in accordance with the following standard.

A: The value Δ[(contact angle before PEB)−(contact angle after PEB)] was 10° or more.
B: The value Δ[(contact angle before PEB)−(contact angle after PEB)] was 5° or more and less than 10°.
C: The value Δ[(contact angle before PEB)−(contact angle after PEB)] was less than 5°.

Measurement of contact angle with developer: The contact angle was immediately measured by the following method at a temperature of 23° C. (room temperature) and a humidity of 45% under atmospheric pressure using a contact angle meter "DSA-10" (manufactured by KRUS). Specifically, the position of the wafer stage of the contact angle meter was adjusted, and the substrate was placed on the stage. After injecting a developer into the needle, the position of the needle was adjusted to the initial position at which a droplet can be formed on the substrate. The developer was discharged from the needle to form a droplet (25 μl), and the contact angle formed by the liquid surface and the substrate was measured.

Difference between advancing contact angle and receding contact angle (Δ[(advancing contact angle)−(receding contact angle)): The difference between the advancing contact angle and the receding contact angle (Δ[(advancing contact angle)−(receding contact angle)] was calculated using the measurement results, and evaluated in accordance with the following standard.

A: The absolute value of the difference Δ[(advancing contact angle)−(receding contact angle) was less than 20°.
B: The absolute value of the difference Δ[(advancing contact angle)−(receding contact angle) was 20° or more.

Measurement of advancing contact angle: A substrate (wafer) on which a film of the radiation-sensitive composition had been formed was prepared, and the advancing contact angle was immediately measured by the following method using a contact angle meter "DSA-10" (manufactured by KRUS) at a temperature of 23° C. (room temperature) and a humidity of 45% under atmospheric pressure.

(1) Adjust the position of the wafer stage.
(2) Place the wafer on the stage.
(3) Inject water into the needle.
(4) Finely adjust the position of the needle.
(5) Discharge water from the needle to form a waterdrop (25 μl) on the wafer.
(6) Remove the needle from the waterdrop.
(7) Move the needle downward to the position adjusted in (4).
(8) Suck the waterdrop through the needle at 10 μl/min for 90 seconds, and measure the contact angle every second (90 times in total).
(9) Calculate the average value of twenty contact angle measured values (20 seconds) as the receding contact angle after the measured value became stable.

Evaluation of DP pattern: The evaluation substrate C was observed using a scanning electron microscope ("S-9380" manufactured by Hitachi High-Technologies Corporation). A case where the first resist pattern was lost or insoluble matter was observed at the bottom of the opening was evaluated as "Bad", and a case where the first resist pattern and the second resist pattern were formed (resolved) without top loss and scum was evaluated as "Good". In Examples 23 to 25 and Comparative Examples 9 to 11, a line-and-space pattern (48 nm line/96 nm pitch (48 nm 1L/1S)) was formed to intersect the first resist pattern, and a case where a contact hole pattern was formed was evaluated as "Good".

Change in line width: A change in line width of the first resist pattern of the evaluation substrate B and the evaluation substrate C was observed using a scanning electron microscope ("S-9380" manufactured by Hitachi High-Technologies Corporation). A case where a change in line width was less than 4 nm was evaluated as "Excellent", a case where a change in line width was 4 to 7 nm was evaluated as "Good", and a case where a change in line width was more than 8 nm was evaluated as "Bad".

Polymers (A), (B), and (F) were produced as follows. The following monomers (M-1) to (M-22) were used to synthesize the polymers (A), (B), and (F).

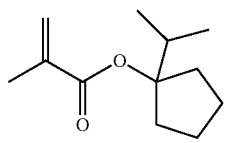

(M-1)

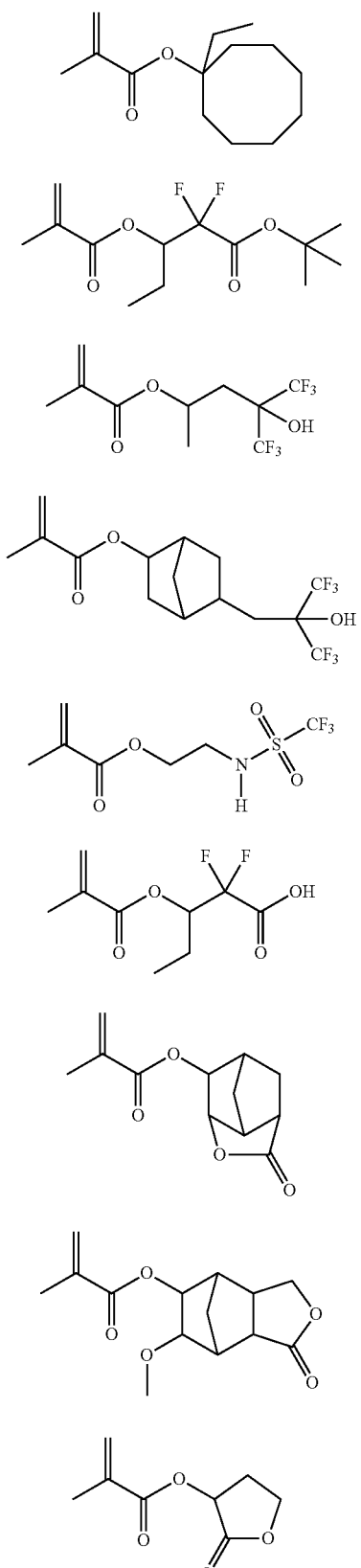
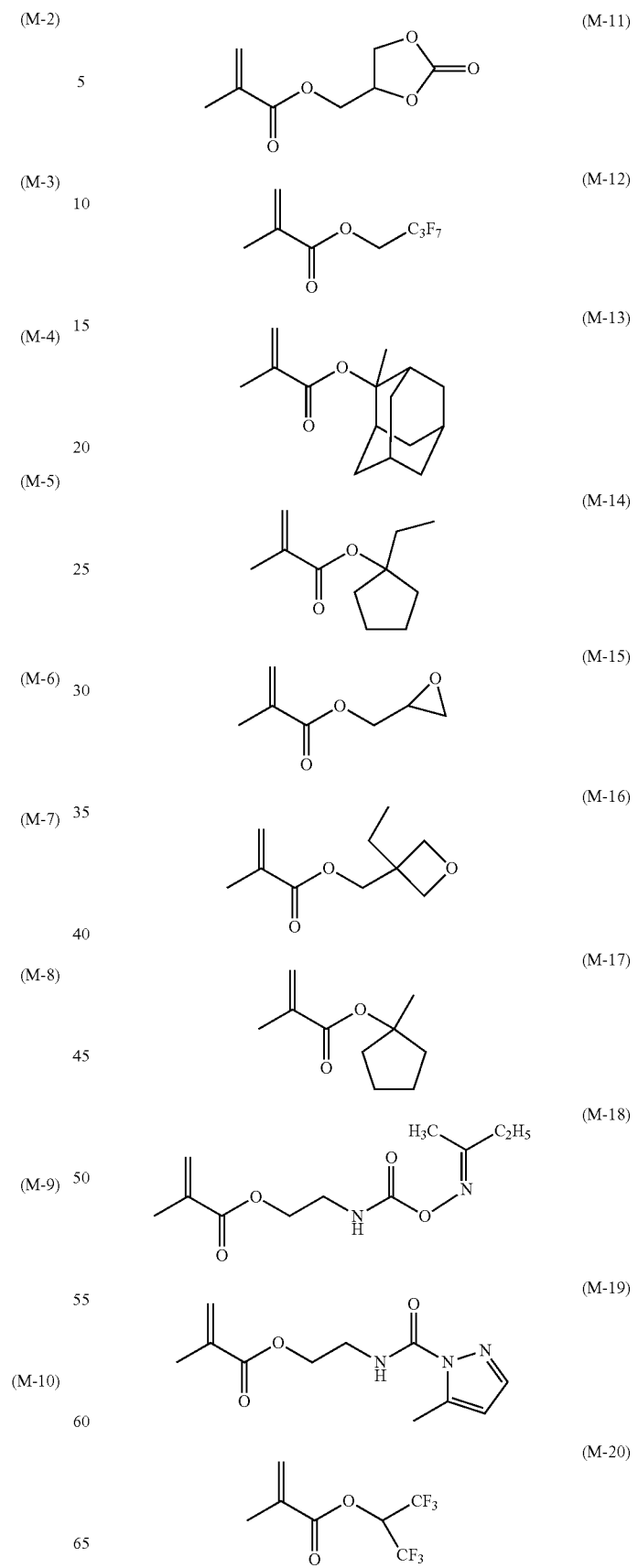

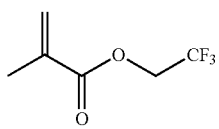

(M-21)

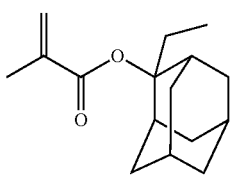

(M-22)

POLYMERIZATION EXAMPLE 1

Production of Polymer (A-1)

15 mol % of the monomer (M-14), 35 mol % of the monomer (M-13), 50 mol % of the monomer (M-8), and an initiator (dimethyl-2,2'-azobisisobutyrate (MAIB)) were dissolved in 100 g of methyl ethyl ketone to prepare a monomer solution. The total amount of the monomers was adjusted to 50 g. Note that the amount (mol %) of each monomer is based on the total amount of the monomers. The initiator was used in an amount of 2 mol % based on the total amount of the monomers and the initiator. A 500 ml three-necked flask equipped with a thermometer and a dropping funnel was charged with 50 g of methyl ethyl ketone, and purged with nitrogen for 30 minutes. The inside of the flask was heated to 80° C. with stirring using a magnetic stirrer. The monomer solution was added dropwise to the flask over three hours using the dropping funnel. After the addition, the mixture was aged for three hours, and cooled to 30° C. or less to obtain a polymer solution. The polymer solution was added to 1000 g of methanol, followed by mixing. A powder was collected by suction filtration, and added to 200 g of methanol, washed, and filtered. After again washing the powder, the powder was collected, and dried at 60° C. under reduced pressure. The resulting polymer is referred to as "polymer (A-1)". The polymer (copolymer) (A-1) had an Mw of 10,000 and an Mw/Mn ratio of 1.5. The ratio of repeating units derived from the monomers ((M-14)/(M-13)/(M-8)) determined by $^{13}$C-NMR analysis was 14.6/35.9/49.5 (mol %).

POLYMERIZATION EXAMPLE 8

Production of Polymer (B-1)

50 mol % of the monomer (M-2), 5 mol % of the monomer (M-19), 45 mol % of the monomer (M-8), and an initiator (dimethyl-2,2'-azobisisobutyrate (MAIB)) were dissolved in 100 g of methyl ethyl ketone to prepare a monomer solution. The total amount of the monomers was adjusted to 50 g. Note that the amount (mol %) of each monomer is based on the total amount of the monomers. The initiator was used in an amount of 8 mol % based on the total amount of the monomers and the initiator. A 500 ml three-necked flask equipped with a thermometer and a dropping funnel was charged with 50 g of methyl ethyl ketone, and purged with nitrogen for 30 minutes. The inside of the flask was heated to 80° C. with stirring using a magnetic stirrer. The monomer solution was added dropwise to the flask over three hours using the dropping funnel. After the addition, the mixture was aged for three hours, and cooled to 30° C. or less to obtain a polymer solution. The polymer solution was added to 1000 g of methanol, followed by mixing. A powder was collected by suction filtration, and added to 200 g of methanol, washed, and filtered. After again washing the powder, the powder was collected, and dried at 60° C. under reduced pressure. The resulting polymer is referred to as "polymer (B-1)". The polymer (copolymer) (B-1) had an Mw of 5000 and an Mw/Mn ratio of 1.6. The ratio of repeating units derived from the monomers ((M-2)/(M-19)/(M-8)) determined by $^{13}$C-NMR analysis was 49.5/5.0/45.5 (mol %).

POLYMERIZATION EXAMPLE 16

Production of Polymer (F-1)

25 mol % of the monomer (M-3), 60 mol % of the monomer (M-1), 15 mol % of the monomer (M-4), and an initiator (dimethyl-2,2'-azobisisobutyrate (MAIB)) were dissolved in 50 g of methyl ethyl ketone to prepare a monomer solution. The total amount of the monomers was adjusted to 50 g. Note that the amount (mol %) of each monomer is based on the total amount of the monomers. The initiator was used in an amount of 8 mol % based on the total amount of the monomers and the initiator. A 500 ml three-necked flask equipped with a thermometer and a dropping funnel was charged with 50 g of methyl ethyl ketone, and purged with nitrogen for 30 minutes. The inside of the flask was heated to 80° C. with stirring using a magnetic stirrer. The monomer solution was added dropwise to the flask over three hours using the dropping funnel. After the addition, the mixture was aged for three hours, and cooled to 30° C. or less to obtain a polymer solution. The polymer solution was transferred to a 2 l separating funnel, and homogeneously diluted with 150 g of n-hexane. After the addition of 600 g of methanol, the components were mixed. After the addition of 30 g of distilled water, the mixture was stirred, and allowed to stand for 30 minutes. The lower layer was collected, and dissolved in propylene glycol monomethyl ether acetate. The polymer contained in the propylene glycol monomethyl ether acetate solution is referred to as "polymer (F-1)". The polymer (copolymer) (F-1) had an Mw of 6500 and an Mw/Mn ratio of 1.7. The ratio of repeating units derived from the monomers ((M-3)/(M-1)/(M-4)) determined by $^{13}$C-NMR analysis was 26.6:58.2:15.2 (mol %).

POLYMERIZATION EXAMPLES 2 to 7

Production of Polymers (A-2) to (A-7)

Polymers (A-2) to (A-7) were produced in the same manner as in Polymerization Example 1, except for changing the types and the amounts of monomers as shown in Tables 1-1 and 1-2. The compositional ratio (determined by $^{13}$C-NMR analysis), the weight average molecular weight (Mw), and the dispersity (Mw/Mn) of the polymers (A-1) to (A-7) are shown in Tables 2-1 and 2-2.

POLYMERIZATION EXAMPLES 9 to 15

Production of Polymers (B-2) to (B-8)

Polymers (B-2) to (B-8) were produced in the same manner as in Polymerization Example 8, except for changing the types and the amounts of monomers as shown in Tables 1-1 and 1-2. The compositional ratio (determined by $^{13}$C-NMR analysis), the weight average molecular weight (Mw), and the dispersity (Mw/Mn) of the polymers (B-2) to (B-8) are shown in Tables 2-1 and 2-2.

POLYMERIZATION EXAMPLES 17 to 20 and Reference Examples 1 to 9

Production of Polymers (F-2) to (F-14)

Polymers (F-2) to (F-14) were produced in the same manner as in Polymerization Example 16, except for changing the types and the amounts of monomers as shown in Tables 1-1 and 1-2. The compositional ratio (determined by $^{13}$C-NMR analysis), the weight average molecular weight (Mw), and the dispersity (Mw/Mn) of the polymers (F-1) to (F-14) are shown in Tables 2-1 and 2-2.

TABLE 1-1

| | Polymer | Monomer 1 | Amount (mol %) | Monomer 2 | Amount (mol %) | Monomer 3 | Amount (mol %) | Monomer 4 | Amount (mol %) |
|---|---|---|---|---|---|---|---|---|---|
| Polymerization Example 1 | A-1 | M-14 | 15 | M-13 | 35 | M-8 | 50 | — | |
| Polymerization Example 2 | A-2 | M-13 | 50 | M-8 | 50 | — | | — | |
| Polymerization Example 3 | A-3 | M-17 | 35 | M-22 | 15 | M-8 | 50 | — | |
| Polymerization Example 4 | A-4 | M-14 | 5 | M-13 | 45 | M-8 | 50 | — | |
| Polymerization Example 5 | A-5 | M-14 | 15 | M-13 | 35 | M-8 | 40 | M-11 | 10 |
| Polymerization Example 6 | A-6 | M-17 | 35 | M-22 | 15 | M-8 | 40 | M-11 | 10 |
| Polymerization Example 7 | A-7 | M-14 | 15 | M-13 | 35 | M-8 | 40 | M-4 | 10 |
| Polymerization Example 8 | B-1 | M-2 | 50 | M-19 | 5 | M-8 | 45 | — | |
| Polymerization Example 9 | B-2 | M-14 | 50 | M-19 | 5 | M-8 | 45 | — | |
| Polymerization Example 10 | B-3 | M-2 | 50 | M-19 | 2 | M-8 | 48 | — | |
| Polymerization Example 11 | B-4 | M-1 | 50 | M-19 | 5 | M-8 | 45 | — | |
| Polymerization Example 12 | B-5 | M-2 | 50 | M-19 | 5 | M-11 | 45 | — | |
| Polymerization Example 13 | B-6 | M-14 | 50 | M-16 | 10 | M-15 | 5 | M-8 | 35 |
| Polymerization Example 14 | B-7 | M-14 | 85 | M-16 | 10 | M-15 | 5 | — | |
| Polymerization Example 15 | B-8 | M-2 | 50 | M-18 | 5 | M-8 | 45 | — | |
| Polymerization Example 16 | F-1 | M-3 | 25 | M-1 | 60 | M-5 | 15 | — | |
| Polymerization Example 17 | F-8 | M-3 | 25 | M-1 | 60 | M-10 | 15 | — | |

TABLE 1-2

| | Polymer | Monomer 1 | Amount (mol %) | Monomer 2 | Amount (mol %) | Monomer 3 | Amount (mol %) | Monomer 4 | Amount (mol %) |
|---|---|---|---|---|---|---|---|---|---|
| Polymerization Example 18 | F-10 | M-3 | 25 | M-1 | 60 | M-12 | 15 | — | |
| Polymerization Example 19 | F-11 | M-14 | 70 | M-21 | 30 | — | | — | |
| Polymerization Example 20 | F-12 | M-14 | 85 | M-20 | 15 | — | | — | |
| Reference Example 1 | F-2 | M-3 | 35 | M-1 | 60 | M-5 | 5 | — | |
| Reference Example 2 | F-3 | M-3 | 25 | M-2 | 60 | M-5 | 15 | — | |
| Reference Example 3 | F-4 | M-3 | 25 | M-1 | 60 | M-6 | 15 | — | |
| Reference Example 4 | F-5 | M-3 | 25 | M-1 | 60 | M-7 | 15 | — | |
| Reference Example 5 | F-6 | M-3 | 25 | M-1 | 60 | M-8 | 15 | — | |
| Reference Example 6 | F-7 | M-3 | 25 | M-1 | 60 | M-9 | 15 | — | |
| Reference Example 7 | F-9 | M-3 | 25 | M-1 | 60 | M-11 | 15 | — | |
| Reference Example 8 | F-13 | M-3 | 80 | M-8 | 20 | — | | — | |
| Reference Example 9 | F-14 | M-12 | 30 | M-13 | 70 | — | | — | |

TABLE 2-1

|  | Polymer | Monomer 1 (mol %) | Monomer 2 (mol %) | Monomer 3 (mol %) | Monomer 4 (mol %) | Mw | Mw/Mn |
|---|---|---|---|---|---|---|---|
| Polymerization Example 1 | A-1 | 26.6 | 58.2 | 15.2 | — | 10000 | 1.5 |
| Polymerization Example 2 | A-2 | 50.2 | 48.8 | — | — | 10000 | 1.6 |
| Polymerization Example 3 | A-3 | 35.5 | 14.5 | 50.5 | — | 10000 | 1.6 |
| Polymerization Example 4 | A-4 | 15.2 | 35.2 | 49.6 | — | 10000 | 1.6 |
| Polymerization Example 5 | A-5 | 14.5 | 35.5 | 39.6 | 9.4 | 11000 | 1.5 |
| Polymerization Example 6 | A-6 | 35.2 | 14.8 | 39.0 | 11.0 | 12000 | 1.5 |
| Polymerization Example 7 | A-7 | 15.1 | 35.8 | 39.5 | 9.6 | 11000 | 1.5 |
| Polymerization Example 8 | B-1 | 50.5 | 5.1 | 44.4 | — | 5000 | 1.6 |
| Polymerization Example 9 | B-2 | 50.2 | 5.0 | 44.8 | — | 5500 | 1.5 |
| Polymerization Example 10 | B-3 | 49.2 | 2.2 | 48.6 | — | 5000 | 1.6 |
| Polymerization Example 11 | B-4 | 50.2 | 5.0 | 44.8 | — | 6000 | 1.5 |
| Polymerization Example 12 | B-5 | 50.2 | 5.0 | 44.8 | — | 5200 | 1.4 |
| Polymerization Example 13 | B-6 | 48.5 | 10.2 | 4.8 | 36.5 | 5500 | 1.5 |
| Polymerization Example 14 | B-7 | 85.5 | 9.5 | 5.0 | — | 6000 | 1.5 |
| Polymerization Example 15 | B-8 | 50.5 | 5.0 | 44.5 | — | 5800 | 1.6 |
| Polymerization Example 16 | F-1 | 26.6 | 58.2 | 15.2 | — | 6500 | 1.7 |
| Polymerization Example 17 | F-8 | 23.8 | 61.1 | 15.1 | — | 7500 | 1.5 |

TABLE 2-2

|  | Polymer | Monomer 1 (mol %) | Monomer 2 (mol %) | Monomer 3 (mol %) | Monomer 4 (mol %) | Mw | Mw/Mn |
|---|---|---|---|---|---|---|---|
| Polymerization Example 18 | F-10 | 27.4 | 57.4 | 15.2 | — | 6100 | 1.6 |
| Polymerization Example 19 | F-11 | 70.2 | 28.8 | — | — | 6300 | 1.7 |
| Polymerization Example 20 | F-12 | 85.2 | 14.8 | — | — | 6900 | 1.7 |
| Reference Example 1 | F-2 | 35.2 | 60.0 | 4.8 | — | 6700 | 1.6 |
| Reference Example 2 | F-3 | 24.4 | 60.5 | 15.1 | — | 6100 | 1.6 |
| Reference Example 3 | F-4 | 27.5 | 58.3 | 14.2 | — | 6200 | 1.6 |
| Reference Example 4 | F-5 | 24.7 | 61.2 | 14.1 | — | 6500 | 1.7 |
| Reference Example 5 | F-6 | 24.4 | 60.8 | 14.8 | — | 7000 | 1.5 |
| Reference Example 6 | F-7 | 24.0 | 60.5 | 15.5 | — | 6900 | 1.6 |
| Reference Example 7 | F-9 | 22.5 | 62.0 | 15.5 | — | 7400 | 1.5 |
| Reference Example 8 | F-13 | 79.5 | 20.5 | — | — | 6600 | 1.6 |
| Reference Example 9 | F-14 | 28.8 | 70.2 | — | — | 6300 | 1.5 |

EXAMPLE 1

Production of First Positive-tone Radiation-sensitive Composition 90 parts of the polymer (A-1) (polymer (A)), 10 parts of the polymer (B-1) (polymer (B)), 7.5 parts of an acid generator (C-1) (triphenylsulfonium nonafluoro-n-butanesulfonate) (acid generator (C)), 0.94 parts of an acid diffusion controller (E-1) (N-t-butoxycarbonylpyrrolidine) (nitrogen-containing compound (E)), 1287 parts of a solvent (D-1) (propylene glycol monomethyl ether acetate) (solvent (D)), and 551 parts of a solvent (D-2) (cyclohexanone) (solvent (D)) were mixed to obtain a homogeneous solution. The solution was filtered through a membrane filter having a pore size of 200 nm to obtain a coating liquid (1) of the first positive-tone radiation-sensitive composition.

EXAMPLES 2 to 18 and COMPARATIVE EXAMPLES 1 to 5

A coating liquid was prepared in the same manner as in Example 1, except for using a composition shown in Tables 3-1 and 3-2. Note that the amount of each component is based on 100 parts of the polymers (A) and (B) in total.

TABLE 3-1

|  | Polymer (A) | | Polymer (B) | | Polymer (F) | | Acid generator (C) | | Solvent (D) | | | | Nitrogen-containing compound (E) | | Coating liquid |
|---|---|---|---|---|---|---|---|---|---|---|---|---|---|---|---|
|  | Type | Amount (parts) | Type | Amount (parts) | Type | Amount (parts) | Type | Amount (parts) | Type | Amount (parts) | Type | Amount (parts) | Type | Amount (parts) |  |
| Example 1 | A-1 | 90 | B-1 | 10 | — | — | C-1 | 7.5 | D-1 | 1287 | D-2 | 551 | E-1 | 0.94 | (1) |
| Example 2 | A-2 | 90 | B-8 | 10 | — | — | C-1 | 7.5 | D-1 | 1287 | D-2 | 551 | E-1 | 0.94 | (2) |
| Example 3 | A-3 | 90 | B-7 | 10 | — | — | C-1 | 7.5 | D-1 | 1287 | D-2 | 551 | E-1 | 0.94 | (3) |
| Example 4 | A-4 | 90 | B-2 | 10 | — | — | C-1 | 7.5 | D-1 | 1287 | D-2 | 551 | E-1 | 0.94 | (4) |
| Example 5 | A-2 | 90 | B-1 | 10 | — | — | C-1 | 7.5 | D-1 | 1287 | D-2 | 551 | E-1 | 0.94 | (5) |
| Example 6 | A-2 | 90 | B-2 | 10 | — | — | C-1 | 7.5 | D-1 | 1287 | D-2 | 551 | E-1 | 0.94 | (6) |
| Example 7 | A-2 | 90 | B-5 | 10 | — | — | C-1 | 7.5 | D-1 | 1287 | D-2 | 551 | E-1 | 0.94 | (7) |
| Example 8 | A-2 | 90 | B-4 | 10 | — | — | C-1 | 7.5 | D-1 | 1287 | D-2 | 551 | E-1 | 0.94 | (8) |
| Example 9 | A-2 | 90 | B-4 | 10 | — | — | C-1 | 7.5 | D-1 | 1287 | D-2 | 551 | E-1 | 0.94 | (9) |
| Example 10 | A-2 | 60 | B-4 | 40 | — | — | C-1 | 7.5 | D-1 | 1287 | D-2 | 551 | — | — | (10) |
| Example 11 | A-2 | 90 | B-6 | 10 | — | — | C-1 | 7.5 | D-1 | 1287 | D-2 | 551 | E-1 | 0.94 | (11) |
| Example 12 | A-4 | 85 | B-4 | 15 | F-1 | 5 | C-1 | 7.5 | D-1 | 1287 | D-2 | 551 | E-1 | 0.94 | (12) |
| Example 13 | A-1 | 85 | B-4 | 15 | F-11 | 5 | C-1 | 7.5 | D-1 | 1287 | D-2 | 551 | E-1 | 0.94 | (13) |
| Example 14 | A-4 | 85 | B-7 | 15 | F-12 | 5 | C-1 | 7.5 | D-1 | 1287 | D-2 | 551 | E-1 | 0.94 | (14) |
| Example 15 | A-4 | 85 | B-5 | 15 | F-1 | 5 | C-1 | 7.5 | D-1 | 1287 | D-2 | 551 | E-1 | 0.94 | (15) |

TABLE 3-2

|  | Polymer (A) | | Polymer (B) | | Polymer (F) | | Acid generator (C) | | Solvent (D) | | | | Nitrogen-containing compound (E) | | Coating liquid |
|---|---|---|---|---|---|---|---|---|---|---|---|---|---|---|---|
|  | Type | Amount (parts) | Type | Amount (parts) | Type | Amount (parts) | Type | Amount (parts) | Type | Amount (parts) | Type | Amount (parts) | Type | Amount (parts) |  |
| Example 16 | A-5 | 85 | B-5 | 15 | F-11 | 5 | C-1 | 7.5 | D-1 | 1287 | D-2 | 551 | E-1 | 0.94 | (16) |
| Example 17 | A-7 | 85 | B-8 | 15 | F-1 | 5 | C-1 | 7.5 | D-1 | 1287 | D-2 | 551 | E-1 | 0.94 | (17) |
| Example 18 | A-6 | 85 | B-1 | 15 | F-8 | 5 | C-1 | 7.5 | D-1 | 1287 | D-2 | 551 | E-1 | 0.94 | (18) |
| Comparative Example 1 | A-1 | 100 | — | — | — | — | C-1 | 7.5 | D-1 | 1287 | D-2 | 551 | E-1 | 0.94 | (19) |
| Comparative Example 2 | A-2 | 100 | — | — | — | — | C-1 | 7.5 | D-1 | 1287 | D-2 | 551 | E-1 | 0.94 | (20) |
| Comparative Example 3 | A-3 | 100 | — | — | — | — | C-1 | 7.5 | D-1 | 1287 | D-2 | 551 | E-1 | 0.94 | (21) |
| Comparative Example 4 | A-4 | 100 | — | — | — | — | C-1 | 7.5 | D-1 | 1287 | D-2 | 551 | E-1 | 0.94 | (22) |
| Comparative Example 5 | A-3 | 100 | — | — | F-10 | 5 | C-1 | 7.5 | D-1 | 1287 | D-2 | 551 | E-1 | 0.94 | (23) |

The components shown in Tables 3-1 and 3-2 are as follows.

Acid generator (C-1): triphenylsulfonium nonafluoro-n-butanesulfonate

Solvent (D-1): propylene glycol monomethyl ether acetate

Solvent (D-2): cyclohexanone

Nitrogen-containing compound (E-1): N-t-butoxycarbonylpyrrolidine (Production of Second Positive-tone Radiation-sensitive Resin Composition)

100 parts a polymer (B-9) shown by the following formula (B-9) (resin (a)), 7.0 parts of triphenylsulfonium nonafluoro-n-butanesulfonate (photoacid generator), 2.64 parts of a compound (E-2) (acid diffusion controller (E)), and 2014 parts of propylene glycol monomethyl ether acetate (solvent (b)) were mixed to obtain a homogeneous solution. The solution was filtered through a membrane filter having a pore size of 200 nm to obtain a coating liquid (24) of the second positive-tone radiation-sensitive composition. The polymer (B-9) was produced in the same manner as in Polymerization Example 8. The polymer (copolymer) (B-9) had an Mw of 4800 and an Mw/Mn ratio of 1.5.

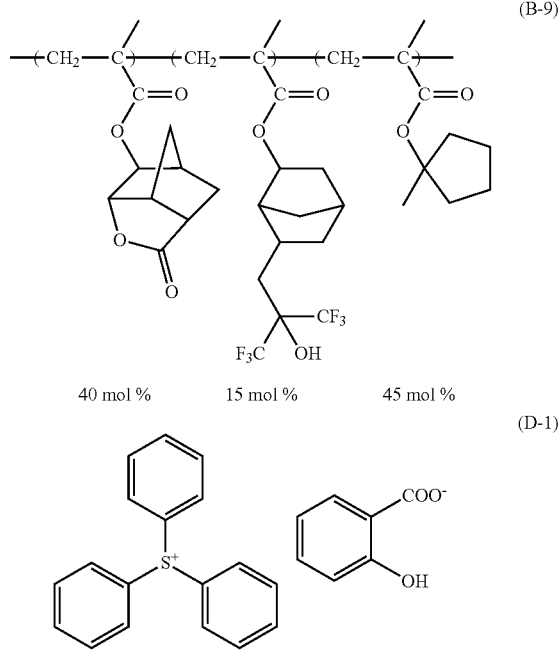

100 parts a polymer (B-10) shown by the following formula (B-10) (resin (a)), 7.0 parts of triphenylsulfonium nonafluoro-n-butanesulfonate (photoacid generator), 2.64 parts of a compound (E-2) (acid diffusion controller (E)), and 2014 parts of propylene glycol monomethyl ether acetate (solvent (b)) were mixed to obtain a homogeneous solution. The solution was filtered through a membrane filter having a pore size of 200 nm to obtain a coating liquid (25) of the second positive-tone radiation-sensitive composition. The polymer (B-10) was produced in the same manner as in Polymerization Example 1. The polymer (copolymer) (B-10) had an Mw of 4800 and an Mw/Mn ratio of 1.5.

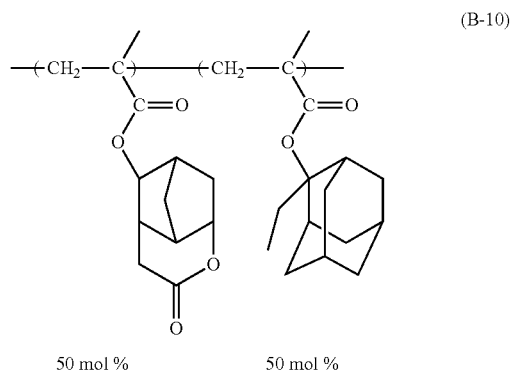 [SMILES: CCC(C)(CC(C)(C)C(=O)OC1(CC)C2CC3CC(C2)CC1C3)C(=O)OC1C2CC3OC(=O)CC1C3C2]

100 parts a polymer (B-11) shown by the following formula (B-11) (resin (a)), 7.0 parts of triphenylsulfonium nonafluoro-n-butanesulfonate (photoacid generator), 2.64 parts of a compound (E-2) (acid diffusion controller (E)), and 2014 parts of propylene glycol monomethyl ether acetate (solvent (b)) were mixed to obtain a homogeneous solution. The solution was filtered through a membrane filter having a pore size of 200 nm to obtain a coating liquid (26) of the second positive-tone radiation-sensitive composition. The polymer (B-11) was produced in the same manner as in Polymerization Example 1. The polymer (copolymer) (B-11) had an Mw of 5500 and an Mw/Mn ratio of 1.6.

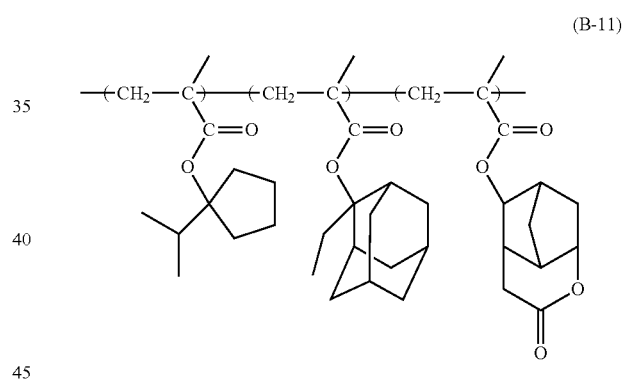

EXAMPLE 19

Formation of Resist Pattern

A lower-layer antireflective film composition ("ARC29A" manufactured by Brewer Science) was spin-coated onto a 12-inch silicon wafer using a system "Lithius Pro-i" (manufactured by Tokyo Electron Ltd.), and prebaked (PB) (205° C., 60 sec) to form a film (thickness: 77 nm). The coating liquid (1) (first positive-tone radiation-sensitive composition) prepared in Example 1 was spin-coated onto the film using a coater/developer "CLEAN TRACK ACT12", prebaked (PB) (130° C., 60 sec), and cooled (23° C., 30 sec) to obtain a first resist layer (thickness: 90 nm).

The first resist layer was exposed through a mask (45 nm line/120 nm pitch) using an ArF liquid immersion lithography system ("S610C" manufactured by Nikon Corp.) (NA: 1.30, Dipole). The first resist layer was subjected to PEB (125° C., 60 sec) on the hot plate of the system "Lithius Pro-i", cooled (23° C., 30 sec), subjected to paddle development (10 sec) using a 2.38% tetramethylammonium hydroxide aqueous solution (using the GP nozzle of the development cup), and rinsed with ultrapure water. The wafer was spin-dried at 2000 rpm for 15 seconds to obtain an evaluation substrate A on which a first resist pattern was formed.

The first resist pattern formed on the evaluation substrate A was subjected to post-development bake (PDB) (200° C., 60 sec) on the hot plate of the coater/developer "CLEAN TRACK ACT12" to obtain an evaluation substrate B.

The coating liquid (24) (second positive-tone radiation-sensitive composition) was spin-coated onto the evaluation substrate B using the coater/developer "CLEAN TRACK ACT12", prebaked (PB) (100° C., 60 sec), and cooled (23° C., 30 sec) to obtain a second resist layer (thickness: 90 nm). The space area of the first resist pattern was exposed through a mask (45 nm line/120 nm pitch) using an ArF liquid immersion lithography system ("S610C" manufactured by Nikon Corp.) (NA: 1.30, Dipole). The resist layer was subjected to PEB (105° C., 60 sec) on the hot plate of the system "Lithius Pro-i", cooled (23° C., 30 sec), subjected to paddle development (30 sec) using a 2.38% tetramethylammonium hydroxide aqueous solution (using the GP nozzle of the development cup), and rinsed with ultrapure water. The substrate was spin-dried at 2000 rpm for 15 seconds to obtain an evaluation substrate C on which a second resist pattern was formed. The DP pattern formed on the evaluation substrate C was evaluated as "Good", and a change in line width was evaluated as "Excellent".

EXAMPLES 20 to 40

An evaluation substrate C was obtained in the same manner as in Example 19 (see Tables 4-1, 4-2, and 4-3). The evaluation results for the resulting evaluation substrate C are shown in Tables 4-1, 4-2, and 4-3. In Examples 30 to 32 and 40, the second resist layer was exposed through a mask (48 nm line/96 nm pitch (48 nm 1L/1S)) to intersect the first resist pattern that was exposed through a mask (48 nm line/96 nm pitch (48 nm 1L/1S)).

TABLE 4-1

| | Step (1) | | | | Step (2) | | | | Step (3) | | | |
| | | PB | PEB | PDB | | UV irradiation conditions | | | PB | PEB | | |
| | Coating liquid | conditions | | conditions | | conditions | | Xe₂ lamp | | Coating liquid | conditions | | conditions | |
| | | Temp. (° C.) | Time (sec) | Temp. (° C.) | Time (sec) | Temp. (° C.) | Time (sec) | (wavelength) | Time (sec) | | Temp. (° C.) | Time (sec) | Temp. (° C.) | Time (sec) |
|---|---|---|---|---|---|---|---|---|---|---|---|---|---|---|
| Example 19 | (1) | 130 | 60 | 125 | 60 | 200 | 60 | — | — | (24) | 100 | 60 | 105 | 60 |
| Example 20 | (2) | 130 | 60 | 125 | 60 | 200 | 60 | — | — | (24) | 100 | 60 | 105 | 60 |
| Example 21 | (3) | 130 | 60 | 125 | 60 | — | — | 172 nm | 60 | (24) | 100 | 60 | 105 | 60 |
| Example 22 | (4) | 130 | 60 | 125 | 60 | 190 | 60 | — | — | (4) | 100 | 60 | 105 | 60 |
| Example 23 | (5) | 130 | 60 | 125 | 60 | 190 | 60 | — | — | (24) | 100 | 60 | 105 | 60 |
| Example 24 | (6) | 130 | 60 | 125 | 60 | 200 | 60 | — | — | (24) | 100 | 60 | 105 | 60 |
| Example 25 | (7) | 130 | 60 | 125 | 60 | 200 | 60 | — | — | (24) | 100 | 60 | 105 | 60 |
| Example 26 | (8) | 130 | 60 | 125 | 60 | 190 | 60 | — | — | (24) | 100 | 60 | 105 | 60 |
| Example 27 | (9) | 130 | 60 | 125 | 60 | 200 | 60 | — | — | (24) | 100 | 60 | 105 | 60 |

| | Receding contact angle (°) | Change in contact angle with developer before and after PEB | Difference between advancing contact angle and receding contact angle | Evaluation of DP pattern | Change in line width |
|---|---|---|---|---|---|
| Example 19 | — | — | — | Good | Excellent |
| Example 20 | — | — | — | Good | Excellent |
| Example 21 | — | — | — | Good | Good |
| Example 22 | — | — | — | Good | Good |
| Example 23 | — | — | — | Good | Excellent |
| Example 24 | — | — | — | Good | Excellent |
| Example 25 | — | — | — | Good | Excellent |
| Example 26 | — | — | — | Good | Excellent |
| Example 27 | — | — | — | Good | Excellent |

TABLE 4-2

| | | Step (1) | | | | Step (2) | | | | Step (3) | | | |
|---|---|---|---|---|---|---|---|---|---|---|---|---|---|
| | | PB conditions | | PEB conditions | | PDB conditions | | UV irradiation conditions | | | PB conditions | | PEB conditions | |
| | Coating liquid | Temp. (°C.) | Time (sec) | Temp. (°C.) | Time (sec) | Temp. (°C.) | Time (sec) | Xe₂ lamp (wavelength) | Time (sec) | Coating liquid | Temp. (°C.) | Time (sec) | Temp. (°C.) | Time (sec) |
| Example 28 | (10) | 130 | 60 | 125 | 60 | 200 | 60 | — | — | (24) | 100 | 60 | 105 | 60 |
| Example 29 | (11) | 130 | 60 | 125 | 60 | 200 | 60 | — | — | (24) | 100 | 60 | 105 | 60 |
| Example 30 | (5) | 130 | 60 | 125 | 60 | 200 | 60 | — | — | (24) | 100 | 60 | 95 | 60 |
| Example 31 | (9) | 130 | 60 | 125 | 60 | 200 | 60 | — | — | (24) | 100 | 60 | 95 | 60 |
| Example 32 | (10) | 130 | 60 | 125 | 60 | 200 | 60 | — | — | (24) | 100 | 60 | 95 | 60 |
| Example 33 | (15) | 130 | 60 | 125 | 60 | 190 | 60 | — | — | (25) | 100 | 60 | 85 | 60 |
| Example 34 | (18) | 120 | 60 | 115 | 60 | 190 | 60 | — | — | (26) | 100 | 60 | 85 | 60 |
| Example 35 | (17) | 120 | 60 | 115 | 60 | 190 | 60 | — | — | (25) | 100 | 60 | 85 | 60 |
| Example 36 | (8) | 130 | 60 | 125 | 60 | 190 | 60 | — | — | (26) | 100 | 60 | 85 | 60 |

| | Receding contact angle (°) | Change in contact angle with developer before and after PEB | Difference between advancing contact angle and receding contact angle | Evaluation of DP pattern | Change in line width |
|---|---|---|---|---|---|
| Example 28 | — | — | — | Good | Excellent |
| Example 29 | — | — | — | Good | Good |
| Example 30 | — | — | — | Good | Good |
| Example 31 | — | — | — | Good | Good |
| Example 32 | — | — | — | Good | Good |
| Example 33 | ≧75 | A | A | Good | Good |
| Example 34 | ≧75 | A | A | Good | Good |
| Example 35 | ≧75 | A | A | Good | Good |
| Example 36 | ≧75 | A | A | Good | Excellent |

TABLE 4-3

| | | Step (1) | | | | Step (2) | | | | Step (3) | | | |
|---|---|---|---|---|---|---|---|---|---|---|---|---|---|
| | | PB conditions | | PEB conditions | | PDB conditions | | UV irradiation conditions | | | PB conditions | | PEB conditions | |
| | Coating liquid | Temp. (°C.) | Time (sec) | Temp. (°C.) | Time (sec) | Temp. (°C.) | Time (sec) | Xe₂ lamp (wavelength) | Time (sec) | Coating liquid | Temp. (°C.) | Time (sec) | Temp. (°C.) | Time (sec) |
| Example 37 | (16) | 130 | 60 | 125 | 60 | 190 | 60 | — | — | (26) | 100 | 60 | 85 | 60 |
| Example 38 | (13) | 130 | 60 | 125 | 60 | 190 | 60 | — | — | (25) | 100 | 60 | 85 | 60 |
| Example 39 | (12) | 130 | 60 | 125 | 60 | 190 | 60 | — | — | (26) | 100 | 60 | 85 | 60 |
| Example 40 | (13) | 130 | 60 | 125 | 60 | 190 | 60 | — | — | (25) | 100 | 60 | 85 | 60 |

| | Receding contact angle (°) | Change in contact angle with developer before and after PEB | Difference between advancing contact angle and receding contact angle | Evaluation of DP pattern | Change in line width |
|---|---|---|---|---|---|
| Example 37 | ≧75 | A | A | Good | Good |
| Example 38 | ≧75 | A | A | Good | Good |
| Example 39 | ≧75 | A | A | Good | Good |
| Example 40 | ≧75 | A | A | Good | Good |

COMPARATIVE EXAMPLES 6 to 10

An evaluation substrate C was obtained in the same manner as in Example 19 (see Table 5). The evaluation results for the resulting evaluation substrate C are shown in Table 5.

TABLE 5

| | | Step (1) | | | | Step (2) | | | | Step (3) | | | |
| | | PB conditions | | PEB conditions | | PDB conditions | | UV irradiation conditions | | | PB conditions | | PEB conditions | |
| | Coating liquid | Temp. (° C.) | Time (sec) | Temp. (° C.) | Time (sec) | Temp. (° C.) | Time (sec) | Xe₂ lamp (wavelength) | Time (sec) | Coating liquid | Temp. (° C.) | Time (sec) | Temp. (° C.) | Time (sec) |
|---|---|---|---|---|---|---|---|---|---|---|---|---|---|---|
| Comparative Example 6 | (19) | 130 | 60 | 125 | 60 | 200 | 60 | — | — | (24) | 100 | 60 | 105 | 60 |
| Comparative Example 7 | (20) | 130 | 60 | 125 | 60 | 200 | 60 | — | — | (24) | 100 | 60 | 105 | 60 |
| Comparative Example 8 | (21) | 130 | 60 | 125 | 60 | 200 | 60 | — | — | (24) | 100 | 60 | 105 | 60 |
| Comparative Example 9 | (22) | 130 | 60 | 125 | 60 | 200 | 60 | — | — | (24) | 100 | 60 | 105 | 60 |
| Comparative Example 10 | (23) | 130 | 60 | 125 | 60 | 200 | 60 | — | — | (24) | 100 | 60 | 105 | 60 |

| | Receding contact angle (°) | Change in contact angle with developer before and after PEB | Difference between advancing contact angle and receding contact angle | Evaluation of DP pattern | Change in line width |
|---|---|---|---|---|---|
| Comparative Example 6 | — | — | — | Bad | Bad |
| Comparative Example 7 | — | — | — | Bad | Bad |
| Comparative Example 8 | — | — | — | Bad | Bad |
| Comparative Example 9 | — | — | — | Bad | Bad |
| Comparative Example 10 | ≧75 | A | A | Bad | Bad |

As shown in Tables 4-1, 4-2, 4-3, and 5, the resist pattern-forming method using the positive-tone radiation-sensitive composition according to the examples of the embodiment of the invention can form a DP pattern that exceeds the wavelength limit without causing a large change in line width.

A pattern that exceeds the wavelength limit can be formed advantageously and economically by the resist pattern-forming method using the above positive-tone radiation-sensitive composition. Therefore, the above positive-tone radiation-sensitive composition may suitably be used in the field of microfabrication such as production of integrated circuit devices that are expected to be further miniaturized in the future.

According to the embodiment of the present invention, the positive-tone radiation-sensitive composition may suitably be used for liquid immersion lithography, and may suitably be used to form a first resist layer utilizing double exposure.

According to the embodiment of the present invention, the resist pattern-forming method prevents a situation in which the first resist pattern becomes alkali-soluble when forming the second resist pattern utilizing double exposure, so that the second resist pattern can be formed while maintaining the first resist pattern. Moreover, a change in line width of the first resist pattern can be suppressed. Therefore, the above resist pattern-forming method may suitably used for liquid immersion lithography.

Obviously, numerous modifications and variations of the present invention are possible in light of the above teachings. It is therefore to be understood that within the scope of the appended claims, the invention may be practiced otherwise than as specifically described herein.

The invention claimed is:

1. A positive-tone radiation-sensitive composition used in a resist pattern-forming method as a first positive-tone radiation-sensitive composition and comprising:
   a first polymer including an acid-labile group and a crosslinkable group;
   a photoacid generator;
   a solvent; and,
   the resist pattern-forming method comprising:
      providing the first positive-tone radiation-sensitive composition on a substrate to form a first resist pattern on the substrate;
      making the first resist pattern to be inactive to light or heat so that the first resist pattern is insoluble in a second positive-tone radiation-sensitive composition; and
      providing the second positive-tone radiation-sensitive composition on the substrate to form a second resist pattern on the substrate on which the first resist pattern is formed,
   wherein the first polymer includes at least one of a fourth repeating unit shown by a following formula (3-1) and a fifth repeating unit shown by a following formula (3-2),

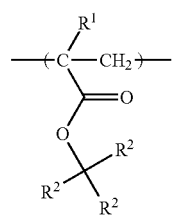 (1)

wherein $R^1$ represents a hydrogen atom, a methyl group, or a trifluoromethyl group, and each of $R^2$ represents at least one of a linear or branched alkyl group having 1 to 4 carbon atoms and a monovalent alicyclic hydrocarbon group having 4 to 20 carbon atoms, or two of $R^2$ bond to form a divalent alicyclic hydrocarbon group having 4 to 20 carbon atoms, or a derivative thereof, together with the carbon atom that is bonded thereto, and the remaining $R^2$ represents a linear or branched alkyl group having 1 to 4 carbon atoms, a monovalent alicyclic hydrocarbon group having 4 to 20 carbon atoms, or a derivative thereof,

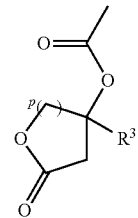 (2-1)

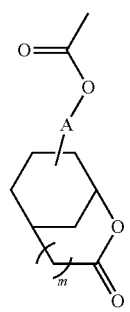 (2-2)

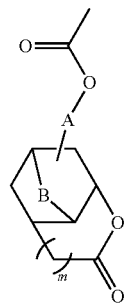 (2-3)

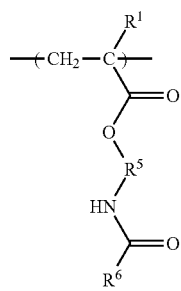 (3-1)

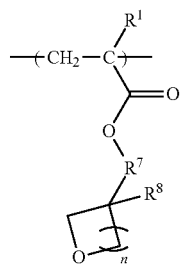 (3-2)

wherein $R^1$ represents a hydrogen atom, a methyl group, or a trifluoromethyl group, $R^5$ represents a methylene group, an ethylene group, or a propylene group, $R^6$ represents a group shown by a following general formula (4) or a group shown by a following formula (5), $R^7$ represents a methylene group or an alkylene group having 2 to 6 carbon atoms, $R^8$ represents a hydrogen atom, a methyl group, or an ethyl group, and n is 0 or 1,

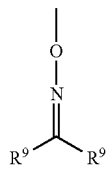 (4)

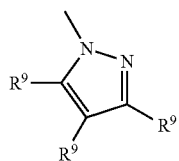 (5)

wherein each of $R^9$ represents at least one of a hydrogen atom and a linear or branched alkyl group having 1 to 10 carbon atoms.

2. The positive-tone radiation-sensitive composition according to claim 1, further comprising a second polymer that includes an acid-labile group and that does not include a crosslinkable group.

3. The positive-tone radiation-sensitive composition according to claim 2, wherein each of the first polymer and the second polymer includes
   a first repeating unit that includes an acid-labile group and that is shown by a following formula (1), and
   a second repeating unit that includes at least one of lactone units respectively shown by following formulas (2-1) to (2-6), or a third repeating unit shown by a following formula (2-7), (2-4)

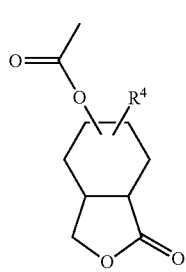

(2-5)

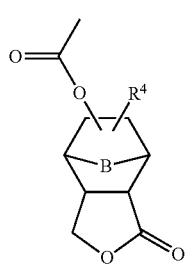

(2-6)

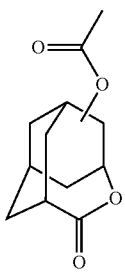

wherein $R^3$ represents a hydrogen atom, or a substituted or unsubstituted alkyl group having 1 to 4 carbon atoms, p is an integer from 1 to 3, $R^4$ represents a hydrogen atom or a methoxy group, A represents a single bond or a methylene group, m is 0 or 1, and B represents an oxygen atom or a methylene group, (2-7)

wherein $R^m$ represents a hydrogen atom, a methyl group, or a trifluoromethyl group, each of $R^{11}$ represents at least one of a hydrogen atom and a chain-like hydrocarbon group having 1 to 5 carbon atoms, D represents a single bond, a divalent or trivalent chain-like hydrocarbon group having 1 to 30 carbon atoms, a divalent or trivalent alicyclic hydrocarbon group having 3 to 30 carbon atoms, or a divalent or trivalent aromatic hydrocarbon group having 6 to 30 carbon atoms, provided that a carbon atom included in D is bonded to a carbon atom that forms the cyclic carbonate to form a cyclic structure when D represents a trivalent group, and n is an integer from 2 to 4.

4. The positive-tone radiation-sensitive composition according to claim 1, wherein the first polymer includes the fourth repeating unit shown by the formula (3-1) or the fifth repeating unit shown by the formula (3-2) in an amount of 1 to 30 mol % based on a total amount (=100 mol %) of the repeating units included in the first polymer.

5. The positive-tone radiation-sensitive composition according to claim 1, further comprising a third polymer that includes at least one of a sixth repeating unit shown by a following formula (10) and a seventh repeating unit shown by a following formula (11), (10)

(11)

wherein $R^{27}$ represents a hydrogen atom, a methyl group, or a trifluoromethyl group, $R^{28}$ represents a single bond or a linear, branched, or cyclic saturated or unsaturated divalent hydrocarbon group having 1 to 20 carbon atoms, X represents a methylene group substituted with a fluorine atom, or a linear or branched fluoroalkylene group having 2 to 20 carbon atoms, $R^{29}$ represents a hydrogen atom or a monovalent organic group, $R^{30}$ represents a hydrogen atom, a methyl group, or a trifluoromethyl group, Y represents a linking group, and $R^{31}$ represents a linear or branched alkyl group having 1 to 6 carbon atoms that is substituted with at least one fluorine atom, an alicyclic hydrocarbon group having 4 to 20 carbon atoms that is substituted with at least one fluorine atom, or a derivative thereof.

6. The positive-tone radiation-sensitive composition according to claim 5, wherein a content of the third polymer is 0.1 to 20 parts by mass based on 100 parts by mass of the first polymer and the second polymer in total.

7. The positive-tone radiation-sensitive composition according to claim 2, wherein the first polymer includes the fourth repeating unit shown by the formula (3-1) or the fifth repeating unit shown by the formula (3-2) in an amount of 1 to 30 mol % based on a total amount (=100 mol %) of the repeating units included in the first polymer.

8. The positive-tone radiation-sensitive composition according to claim 3, wherein the first polymer includes the fourth repeating unit shown by the formula (3-1) or the fifth repeating unit shown by the formula (3-2) in an amount of 1 to 30 mol % based on a total amount (=100 mol %) of the repeating units included in the first polymer.

9. The positive-tone radiation-sensitive composition according to claim 2, further comprising a third polymer that includes at least one of a sixth repeating unit shown by a following formula (10) and a seventh repeating unit shown by a following formula (11),

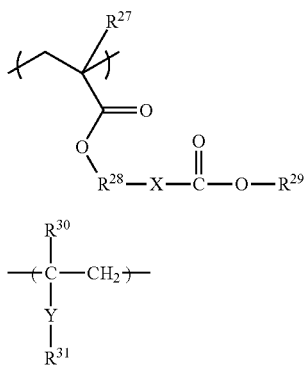

(10)

(11)

wherein R$^{27}$ represents a hydrogen atom, a methyl group, or a trifluoromethyl group, R$^{28}$ represents a single bond or a linear, branched, or cyclic saturated or unsaturated divalent hydrocarbon group having 1 to 20 carbon atoms, X represents a methylene group substituted with a fluorine atom, or a linear or branched fluoroalkylene group having 2 to 20 carbon atoms, R$^{29}$ represents a hydrogen atom or a monovalent organic group, R$^{30}$ represents a hydrogen atom, a methyl group, or a trifluoromethyl group, Y represents a linking group, and R$^{31}$ represents a linear or branched alkyl group having 1 to 6 carbon atoms that is substituted with at least one fluorine atom, an alicyclic hydrocarbon group having 4 to 20 carbon atoms that is substituted with at least one fluorine atom, or a derivative thereof.

10. The positive-tone radiation-sensitive composition according to claim 3, further comprising a third polymer that includes at least one of a sixth repeating unit shown by a following formula (10) and a seventh repeating unit shown by a following formula (11),

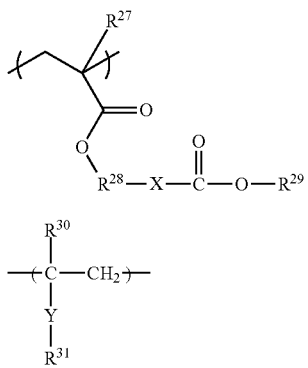

(10)

(11)

wherein R$^{27}$ represents a hydrogen atom, a methyl group, or a trifluoromethyl group, R$^{28}$ represents a single bond or a linear, branched, or cyclic saturated or unsaturated divalent hydrocarbon group having 1 to 20 carbon atoms, X represents a methylene group substituted with a fluorine atom, or a linear or branched fluoroalkylene group having 2 to 20 carbon atoms, R$^{29}$ represents a hydrogen atom or a monovalent organic group, R$^{30}$ represents a hydrogen atom, a methyl group, or a trifluoromethyl group, Y represents a linking group, and R$^{31}$ represents a linear or branched alkyl group having 1 to 6 carbon atoms that is substituted with at least one fluorine atom, an alicyclic hydrocarbon group having 4 to 20 carbon atoms that is substituted with at least one fluorine atom, or a derivative thereof.

11. The positive-tone radiation-sensitive composition according to claim 4, further comprising a third polymer that includes at least one of a sixth repeating unit shown by a following formula (10) and a seventh repeating unit shown by a following formula (11),

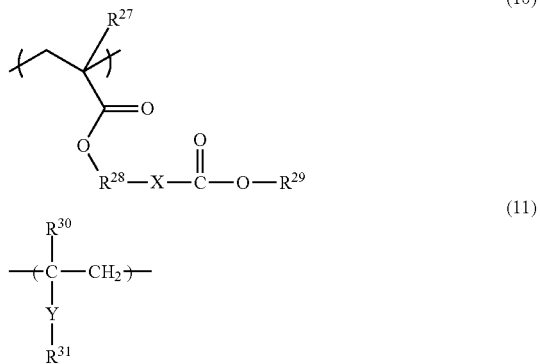

wherein R$^{27}$ represents a hydrogen atom, a methyl group, or a trifluoromethyl group, R$^{28}$ represents a single bond or a linear, branched, or cyclic saturated or unsaturated divalent hydrocarbon group having 1 to 20 carbon atoms, X represents a methylene group substituted with a fluorine atom, or a linear or branched fluoroalkylene group having 2 to 20 carbon atoms, R$^{29}$ represents a hydrogen atom or a monovalent organic group, R$^{30}$ represents a hydrogen atom, a methyl group, or a trifluoromethyl group, Y represents a linking group, and R$^{31}$ represents a linear or branched alkyl group having 1 to 6 carbon atoms that is substituted with at least one fluorine atom, an alicyclic hydrocarbon group having 4 to 20 carbon atoms that is substituted with at least one fluorine atom, or a derivative thereof.

12. The positive-tone radiation-sensitive composition according to claim 7, further comprising a third polymer that includes at least one of a sixth repeating unit shown by a following formula (10) and a seventh repeating unit shown by a following formula (11),

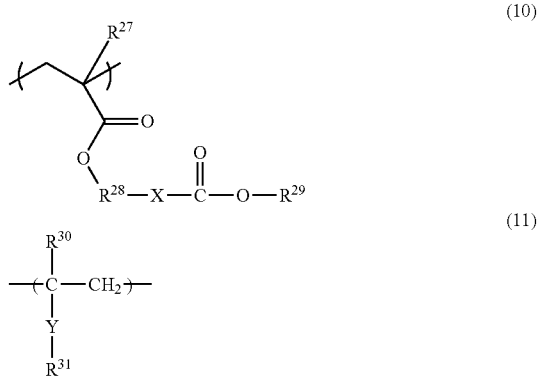

wherein R$^{27}$ represents a hydrogen atom, a methyl group, or a trifluoromethyl group, R$^{28}$ represents a single bond or a linear, branched, or cyclic saturated or unsaturated divalent hydrocarbon group having 1 to 20 carbon atoms, X represents a methylene group substituted with a fluorine atom, or a linear or branched fluoroalkylene group having 2 to 20 carbon atoms, R$^{29}$ represents a hydrogen atom or a monovalent organic group, $R^{30}$ represents a hydrogen atom, a methyl group, or a trifluoromethyl group, Y represents a linking group, and $R^{31}$ represents a linear or branched alkyl group having 1 to 6 carbon atoms that is substituted with at least one fluorine atom, an alicyclic hydrocarbon group having 4 to 20 carbon atoms that is substituted with at least one fluorine atom, or a derivative thereof.

* * * * *